(12) United States Patent
Reinmuth et al.

(10) Patent No.: US 8,778,194 B2
(45) Date of Patent: Jul. 15, 2014

(54) COMPONENT HAVING A THROUGH-CONNECTION

(71) Applicants: Jochen Reinmuth, Reutlingen (DE); Yvonne Bergmann, Reutlingen (DE)

(72) Inventors: Jochen Reinmuth, Reutlingen (DE); Yvonne Bergmann, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/744,611

(22) Filed: Jan. 18, 2013

(65) Prior Publication Data

US 2013/0189483 A1    Jul. 25, 2013

(30) Foreign Application Priority Data

Jan. 20, 2012  (DE) .................... 10 2012 200 840

(51) Int. Cl.
*H01L 21/302* (2006.01)
(52) U.S. Cl.
USPC ........ 216/2; 216/18; 216/41; 216/67; 216/79; 216/88; 438/694; 438/700; 438/702; 438/719; 438/740; 438/778; 438/787; 427/97.2

(58) Field of Classification Search
None
See application file for complete search history.

(56) References Cited

U.S. PATENT DOCUMENTS

| 6,093,330 | A * | 7/2000 | Chong et al. ............... 216/2 |
| 7,884,015 | B2 * | 2/2011 | Sulfridge .................. 438/667 |
| 2011/0169125 | A1 * | 7/2011 | Reinmuth et al. ......... 257/506 |
| 2012/0037412 | A1 * | 2/2012 | Reinmuth ................. 174/260 |
| 2013/0099382 | A1 * | 4/2013 | Reinmuth et al. ......... 257/770 |

* cited by examiner

*Primary Examiner* — Anita Alanko
(74) *Attorney, Agent, or Firm* — Kenyon & Kenyon LLP

(57) ABSTRACT

A method is described for manufacturing a component having a through-connection. The method includes providing a substrate; forming a trench structure in the substrate, a substrate area which is completely surrounded by the trench structure being produced; forming a closing layer for closing off the trench structure, a cavity girded by the closing layer being formed in the area of the trench structure; removing substrate material from the substrate area surrounded by the closed-off trench structure; and at least partially filling the substrate area surrounded by the closed-off trench structure with a metallic material. A component having a through-connection is also described.

10 Claims, 23 Drawing Sheets

COMPONENT HAVING A THROUGH-CONNECTION

CROSS REFERENCE

The present application claims the benefit under 35 U.S.C. §119 of German Patent Application No. DE 102012200840.3 filed on Jan. 20, 2012, which is expressly incorporated herein by reference in its entirety.

FIELD

The present invention relates to a method for manufacturing a component having a through-connection and a component having a through-connection.

BACKGROUND INFORMATION

Electrical contact structures which extend through a substrate or a subarea of a substrate are becoming more and more important. Such contact structures which are also referred to as vias (vertical interconnect access) or through-connections facilitate the manufacture of space-saving components, for example. One possible design are metallic through-connections which are present in the form of electrical connections made of metal. It is usually strived for that the smallest possible through-connections or through-connections having small lateral dimensions are formed which have a relatively low volume resistance at the same time.

Conventional methods for manufacturing metallic through-connections, with the aid of which these objects are to be achieved, include the production of narrow holes or trenches having almost vertical walls in a substrate; the deposition of an insulating layer in the trenches; the opening of the insulating layer in a bottom area of the trenches; and, usually, the deposition of a diffusion barrier layer in the trenches. Subsequently, the trenches are filled up with a metal completely or partially.

The provision of the smallest possible lateral dimensions results in the through-connections, and thus the underlying trenches, having a relatively great aspect ratio (height/width ratio). This proves to be critical with regard to the above-described process sequence. For example, the insulating layer within the trenches may only be designed to have a relatively small layer thickness due to technical reasons. The greater the aspect ratio, the smaller is the producible layer thickness. The provision of greater aspect ratios, but also a greater insulation thickness, results in that opening the insulating layer on the bottom of the trenches is becoming increasingly more difficult. A greater aspect ratio is furthermore associated with the deposition of the diffusion barrier layer within the trenches becoming more difficult. Moreover, conventionally manufactured through-connections may lead to great mechanical stresses in a substrate. The cause thereof are differing thermal expansion coefficients of the metallically filled material and the surrounding substrate material (usually silicon).

SUMMARY

An object of the present invention is to provide an improved approach to the manufacture of a component having a metallic through-connection.

According to the present invention, an example method is provided for manufacturing a component having a through-connection. The example method includes providing a substrate; forming a trench structure in the substrate, a substrate area completely surrounded by the trench structure being produced; and forming a closing layer for closing off the trench structure, a cavity girded by the closing layer being formed in the area of the trench structure. Furthermore, the example method includes removing the substrate material in the substrate area surrounded by the closed-off trench structure and an at least partial filling of the substrate area surrounded by the closed-off trench structure with a metallic material.

The through-connection manufactured in this way includes the substrate area which was initially "hollowed out" as a result of the removal of substrate material and subsequently filled (at least partially) with metallic material and which is surrounded by the closed-off trench structure and by the cavity girded by the closing layer in this area. The metallically filled substrate area is used as the conductive integral part of the through-connection. The example method offers the possibility of forming the closing layer, provided in the area of the trench structure or within the trench structure, in a relatively wide area independently of the aspect ratio of the substrate area to be filled metallically. The substrate area may be manufactured having relatively small lateral dimensions and consequently having a relatively great aspect ratio, whereas the surrounding trench structure may be designed independently thereof to have relatively large lateral dimensions and thus a relatively small aspect ratio. In this way, a simple and reliable manufacture of the closing layer is possible, in particular having a relatively great and uniform layer thickness within the trench structure.

It is also advantageous if the metallically filled substrate area are both electrically insulated from the surrounding substrate and mechanically decoupled therefrom by the enclosed cavity present in the area of the trench structure or within the trench structure. Due to the mechanical decoupling, the occurrence of temperature-induced stresses in the substrate may be avoided. The above-described design of the trench structure (which may be considered) having large lateral dimensions furthermore results in the electrical insulation implemented via the trench structure (or the cavity present there) having a relatively great thickness. In addition to a reliable insulation, it may also be achieved that the through-connection, and thus an associated signal path, are subject to only a small parasitic capacitance. This is particularly advantageous when the component is possibly designed as a micromechanical acceleration sensor.

Another advantage of the example method is that the through-connection is reliably manufacturable even if the provided substrate is relatively thick. It is in particular possible that the substrate area is designed to have relatively small lateral dimensions, as described above, so that it is possible to metallically fill this substrate area rapidly and cost-effectively in spite of the substrate having a great thickness.

The example method may be used with both a single substrate and a substrate of a stacked substrate system. In this regard, the step of providing a substrate may also mean providing a substrate system, a substrate of the substrate system being accordingly provided with a through-connection.

In one preferred specific embodiment of the method, a masking layer is formed on the provided substrate and the trench structure is formed by carrying out an etching process using the masking layer. In this way, the trench structure may be produced very accurately having an appropriate shape and geometry. An anisotropic etching process may, in particular, be used for trench etching.

The masking layer is preferably designed to have a lattice structure which predefines the (lateral) shape of the trench structure. In this way, the trench structure may be closed off not only via the closing layer, but additionally also via the masking layer or its lattice structure. In this way, the trench structure may be reliably closed off even in the case of large lateral dimensions of the trench structure.

In another preferred specific embodiment, forming the closing layer includes forming an insulating layer or forming a diffusion barrier layer and an insulating layer. Layers of this type may be formed (in particular within the trench structure) reliably and independently of the aspect ratio of the substrate area to be metallically filled. With the aid of the diffusion barrier layer, it is possible to prevent a portion of the metallically filled material from diffusing outward. Depending on the metallic material used, it may be considered to omit such a diffusion barrier, if necessary. Furthermore, it is possible to form an insulating layer (as the closing layer) which simultaneously functions as the diffusion barrier.

In another preferred specific embodiment, the substrate is provided with an etch stopping layer. Forming the trench structure and removing substrate material from the substrate area surrounded by the closed-off trench structure both include (to hollow out the substrate) an etching of the substrate until the etch stopping layer is reached. In this way, the individual etching processes may be reliably stopped.

The etch stopping layer may also be used to form a "lower" or "bottom-side" contact section of the through-connection independently of the aspect ratio of the substrate area to be metallically filled. For this purpose, it is provided according to another preferred specific embodiment that the etch stopping layer has a contact surface which is provided in the area of the substrate area to be filled with metallic material. The removal of substrate material in the substrate area surrounded by the closed-off trench structure prior to the metallic filling may be used in this case to expose the contact surface in this area. In this way, it is possible that the metallic material introduced subsequently into the substrate area may electrically contact the contact surface. If necessary, it may be provided that an (additional) conductive diffusion barrier layer is formed in the substrate area prior to the metallic filling of the hollowed-out substrate area.

In another preferred specific embodiment, a portion of the etch stopping layer is removed after the removal of substrate material from the substrate area surrounded by the closed-off trench structure in order to expose a subarea of a conductive layer provided in the area of the etch stopping layer. In this way, it is possible for the metallic material introduced subsequently into the substrate area to electrically contact the conductive layer. In this embodiment, the etch stopping layer may be an insulating layer, in particular, in which the conductive layer is embedded. Here, the conductive layer, which may be used as a printed conductor structure, may be protected with the aid of the insulating etch stopping layer against an etching attack during the removal of substrate material. Prior to metallically filling the hollowed-out substrate area, it may also be provided, if necessary, that an (additional) conductive diffusion barrier layer is formed in the substrate area.

In another preferred specific embodiment, an etching process is carried out to form an opening on a substrate side for exposing a subarea of the substrate area surrounded by the closed-off trench structure. In this way, the substrate area may be exposed, which may be covered on the relevant substrate side (top side or bottom side of the substrate) by the masking layer and the closing layer. Furthermore, the substrate material in the substrate area is removed in a subsequent etching process using the opening. In the subsequent etching process, the closing layer may be used as an etch stop to remove substrate material only in the substrate area surrounded by the closed-off trench structure. In this case, an isotropic etching process is preferably carried out, thus making it possible to achieve great etching selectivity compared to the closing layer.

The substrate area which is filled (at least partially) with the metallic material and which is used as the conductive integral part of the through-connection may have any shape in the top view. One possible example is a circular shape. A rectangular shape or stripes are also possible, for example, whereby a low(er) electrical volume resistance may be implemented, if necessary. The trench structure enclosing the substrate area, and thus the cavity situated in the area of the trench structure or within the trench structure, may also have any shape in the top view, e.g., be circular or rectangular.

In another preferred specific embodiment, it is provided that the trench structure is designed in such a way that not only a single substrate area, but multiple (separate) substrate areas are produced which are completely surrounded by the trench structure. Forming the closing layer for closing off the trench structure thus results in the cavity present in the area of the trench structure and girded by the closing layer possibly surrounding the multiple substrate areas in the same manner. After closing off the trench structure, substrate material is accordingly removed from the multiple substrate areas which are surrounded by the closed-off trench structure. The multiple substrate areas are furthermore filled at least partially with the metallic material. In this embodiment, the multiple metallically filled substrate areas may be used together as the conductive integral part of a single through-connection or through-connection structure. In this case, a system corresponding to a parallel circuit, and thus a relatively low volume resistance, may be present.

Moreover, additional embodiments may be considered for the through-connection. It is, for example, possible that a metallically filled substrate area itself surrounds a trench and, for example, is ring-shaped in the top view. In this regard, it is provided according to another preferred specific embodiment to form a first and a second trench structure in the substrate, the first trench structure completely surrounding the substrate area, and the substrate area completely surrounding the second trench structure. By forming the closing layer, the first and the second trench structures are closed off and a first cavity girded by the closing layer is formed in the area of the first trench structure and a second cavity girded by the closing layer is formed in the area of the second trench structure. The substrate area which may also be filled metallically (at least partially) after the removal of substrate material is thus enclosed by the first trench structure and furthermore encloses the second trench structure. A through-connection having such a design may also have a relatively low volume resistance.

In another preferred specific embodiment, it is provided to form a first and a second trench structure in the substrate, the first trench structure completely surrounding a first substrate area, the first substrate area completely surrounding the second trench structure and the second trench structure completely surrounding a second substrate area. By forming the closing layer, the first and the second trench structures are closed off and a first cavity girded by the closing layer is formed in the area of the first trench structure and a second cavity girded by the closing layer is formed in the area of the second trench structure. Subsequently, substrate material is removed from the first and the second substrate areas and the first and the second substrate areas are then filled at least partially with a metallic material. In the through-connection manufactured in this way, the second (or internal) metallic substrate area is surrounded by the first (or external) metallic substrate area and is electrically insulated from the first metallic substrate area by the second closed-off trench structure (and the cavity present there). The first metallic substrate area is surrounded by the first closed-off trench structure (and the cavity present there) and is in this way electrically insulated and decoupled from the surrounded substrate. Such a "nested" design of the through-connection, e.g., in the form of metal rings nested into one another, also enables a relatively low volume resistance.

According to the present invention, a component is furthermore proposed which has a substrate and a through-connection formed in the substrate. The through-connection has a substrate area which is filled at least partially with a metallic material. The substrate area is completely surrounded by a closed-off trench structure. Furthermore, a cavity girded by a closing layer is formed in the area of the trench structure.

In the component, the metallically filled substrate area, which forms a conductive integral part of the through-connection, is both reliably electrically insulated and mechanically decoupled from the surrounding substrate via the closed-off trench structure or the cavity situated there. To manufacture the component, the method described above or one of the described specific embodiments may be carried out. The advantages named in this context, but also aspects such as a design using a masking layer, a design using an etch stopping layer, a provision of any shape of the metallically filled substrate area and trench structure, a design using multiple substrate areas which are surrounded by the trench structure and filled metallically, a design of the metallically filled substrate area which itself surrounds a trench, a nested design having two metallically filled substrate areas, etc., could apply to the component in the same way.

The advantageous embodiments and refinements of the present invention explained above and/or below may be used alone or also in any combination with each other.

BRIEF DESCRIPTION OF THE DRAWINGS

The present invention is explained below in greater detail with reference to the figures.

DETAILED DESCRIPTION OF EXAMPLE EMBODIMENTS

Based on the following figures, specific embodiments of a method for manufacturing a component having a through-connection are described. During the manufacturing process, processes, e.g., CMOS (complementary metal oxide semiconductor) processes and MEMS (micro-electromechanical system) processes, which are customary in semiconductor or microsystem technology, may be carried out, and customary materials may be used, so that this will be discussed only partially. It is also pointed out that in addition to the illustrated and described method steps and processes, other method steps may be carried out to complete the manufacture of the shown components.

FIGS. 1 through 10 show an example method for manufacturing a component 100 having a through-connection, each in a schematic lateral sectional illustration. The method steps carried out in the example method are also combined in the flow chart of FIG. 11 which is also used as reference in the following. Manufactured component 100 may, for example, represent an integrated circuit or a semiconductor chip. Possible examples thereof include an application-specific integrated circuit (ASIC), a memory component, and a processor or a microprocessor.

Figure 1:
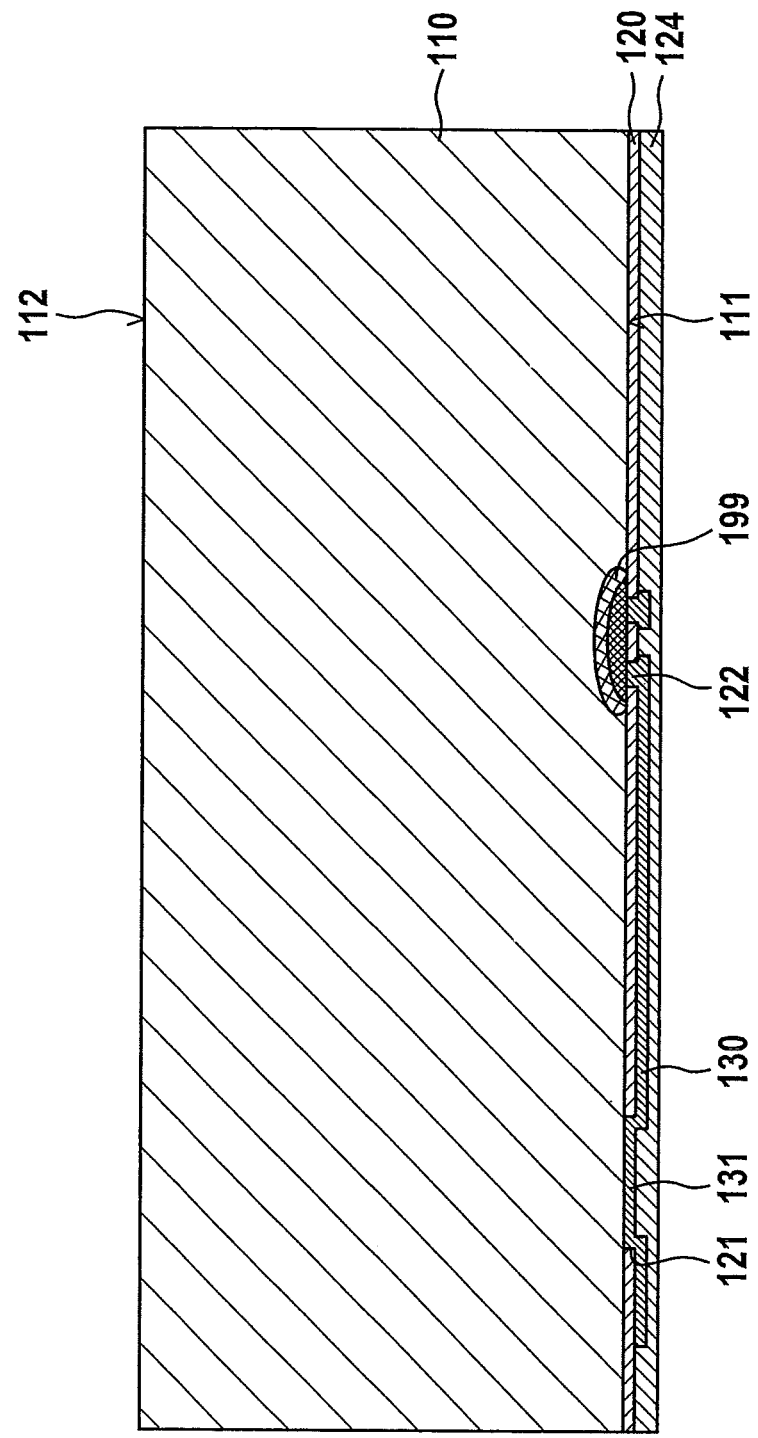
FIGS. 1 through 10 show manufacture of a component having a through-connection, each in a schematic lateral sectional illustration.

At the beginning of the example method, a substrate 110 is provided in a step 301 (cf. FIG. 11) which is shown only sectionally in FIGS. 1 through 10. Substrate 110 may be a wafer made of silicon in particular. As illustrated in FIG. 1, provided substrate 110 furthermore has other structures and layers, which may be produced within the scope of conventional processes, on one side 111, in the following also referred to as bottom side 111. These include, for example, a structure 199 which is formed in substrate 110 and which is a transistor 199, for example.

On bottom side 111, a system is additionally formed from a structured insulating layer 120 and a structured electrically conductive layer 130. Layer 130, which may have a metallic material, is used as a printed conductor and a contact structure for transistor 199. Insulting layer 120, which may be a silicon oxide layer, for example, has multiple openings 122 in the area of transistor 199 and another opening 121 laterally offset thereto. Conductive or metallic layer 130, which is situated outside of openings 121, 122 on insulating layer 120, directly adjoins substrate 110 or its side 111 at these points. A subarea of layer 130 situated in opening 121 forms a contact surface 131 for a through-connection to be manufactured in this area. In this way, an electrical connection is enabled between the later through-connection and transistor 199 via layer 130 and its contact surface 131. As furthermore shown in FIG. 1, the two layers 120, 130 are furthermore covered by another insulating layer 124. Layer 124 which is used for passivation may be a silicon nitride layer or a silicon oxide layer, for example.

Figure 2:
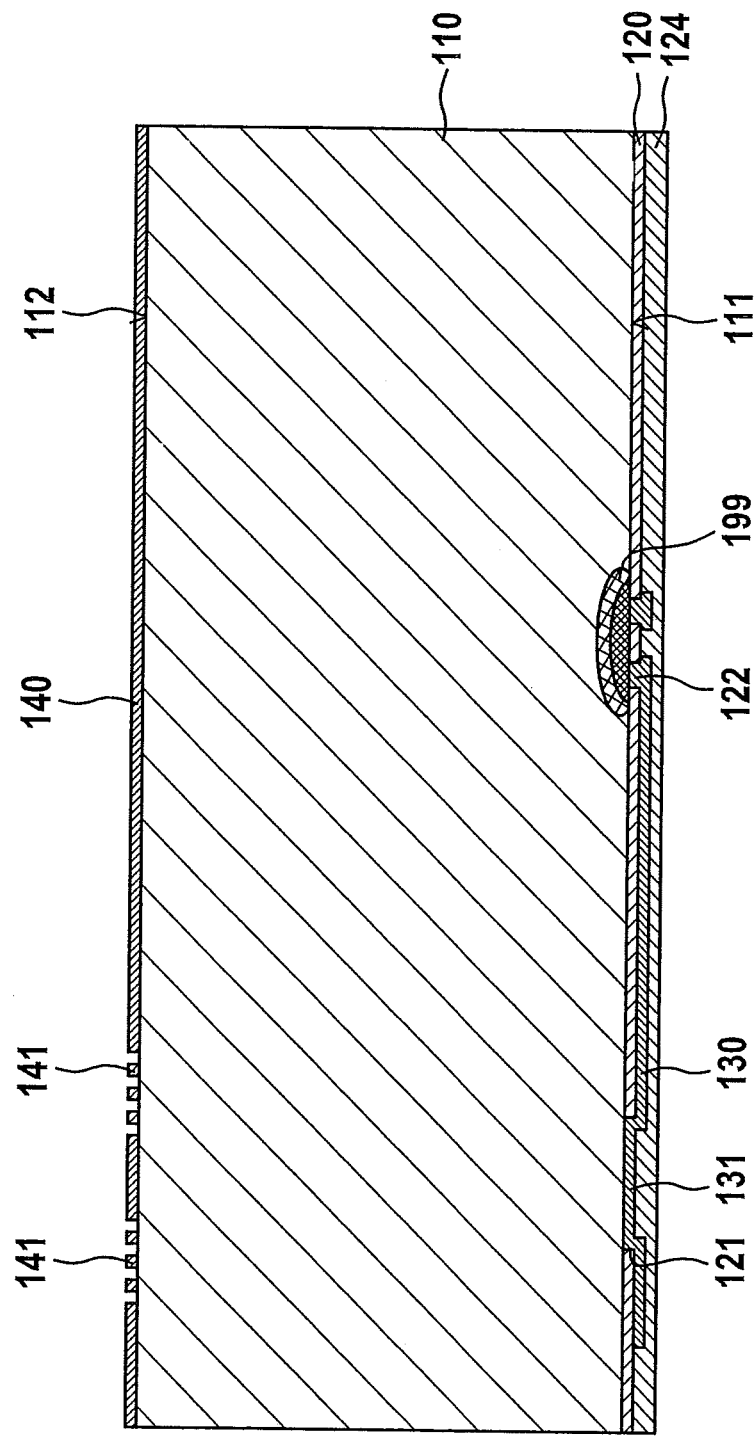
Figure 3:
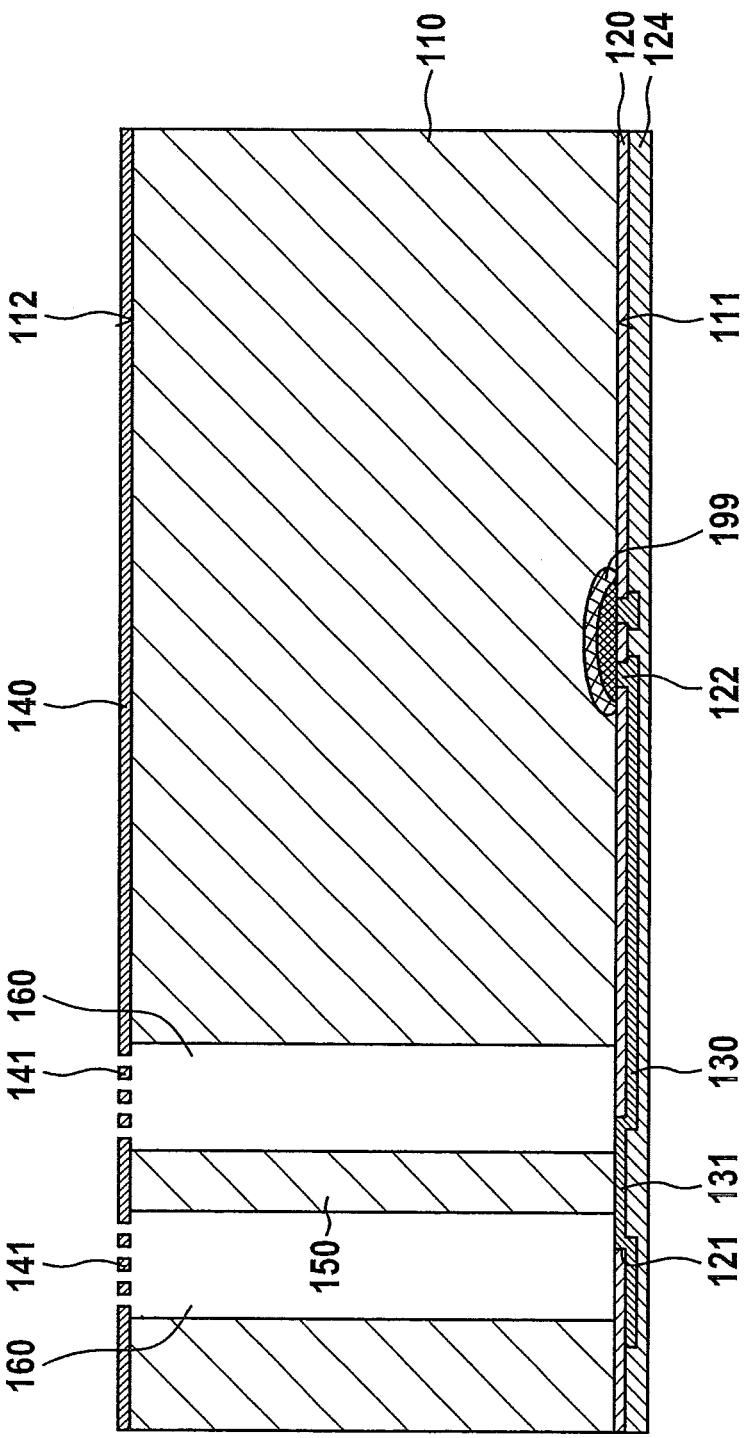

In a subsequent step 302 (cf. FIG. 11), which is explained with reference to FIGS. 2 and 3, a trench structure 160 which extends (vertically) through substrate 110 is formed. For this purpose, a masking layer 140 is initially formed, as illustrated in FIG. 2, on a side 112 of substrate 110 which is opposite to bottom side 111 and is also referred to in the following as top side 112. In a subarea, masking layer 140 has a lattice-shaped perforation which is formed from a plurality of relatively small holes and is referred to in the following as lattice structure 141. Lattice structure 141, which predefines a trench etching area and thus the lateral shape of trench structure 160, is designed in such a way that a subsequent etching of substrate 110 through perforated masking layer 140 is possible. Masking layer 140 may be a (structured) silicon oxide layer ("oxide mask"), for example.

After forming masking layer 140, an anisotropic etching process, in particular a deep reactive ion etching process (DRIE), is carried out, masking layer 140 being used to mask substrate 110. In the course of the etching process, substrate material (silicon) is removed from the etching area predefined by lattice structure 141 starting from top side 112 to bottom side 111 of substrate 110, whereby trench structure 160 which is shown in FIG. 3 and covered or spanned by perforated masking layer 140 is formed in substrate 110. Due to the anisotropic trench etching process, trench structure 160 has (generally) vertical side walls with regard to top and bottom sides 112, 111. Trench etching, which is also referred to as "trenching," results in lattice structure 141 or webs present between the holes of lattice structure 141 being completely undercut.

In the top view, lattice structure 141, and thus also trench structure 160, has a circumferential closed shape, e.g., is rectangular or ring-shaped, so that a substrate area 150, which is completely surrounded by trench structure 160, is produced as a result of the trench etching. Here, it is provided that substrate area 150 adjoins contact surface 131. This may be implemented with the aid of an appropriate design or position of lattice structure 141 with regard to contact surface 131 within the scope of the preceding formation of masking layer 140 on substrate top side 112.

During the trench etching process, insulating layer 120 situated on substrate bottom side 111 may be used as the etch stopping layer where the etching process may be reliably stopped. The introduction of trench structure 160 into substrate 110 therefore results in insulating layer 120 being exposed in the area of trench structure 160. In this regard, it may also be provided, as shown in FIG. 3, that contact surface 131 or a portion of contact surface 131 is also used as an etch stop and contact surface 131 is thus exposed in a (circumferential) edge area. Such a suitability of contact surface 131 is made possible by the above-described metallic design of layer 130 and thus of contact surface 131.

With regard to substrate area 150, which may also be referred to as a "punch" or "silicon punch," it is preferably provided that it is designed to have relatively small lateral dimensions and thus a relatively great aspect ratio (height/width ratio). Trench structure 160 surrounding substrate area 150 is, however, designed to have, independently thereof, relatively large lateral dimensions and consequently a relatively small aspect ratio, whereby subsequent processes may be facilitated. Such conditions may (also) be achieved by an appropriate design of lattice structure 141.

After trench structure 160 has been formed, a closing layer is formed in a step 303 (cf. FIG. 11), which is explained with reference to FIGS. 4 and 5. This has the purpose of closing off trench structure 160 and forming a cavity girded by the closing layer in the area of trench structure 160 or within trench structure 160. In the (exemplary) process sequence shown here, a diffusion barrier layer 171 and subsequently an insulating layer 172 are formed for this purpose, the actual closing off taking place only within the scope of the formation of insulating layer 172.

Figure 4:
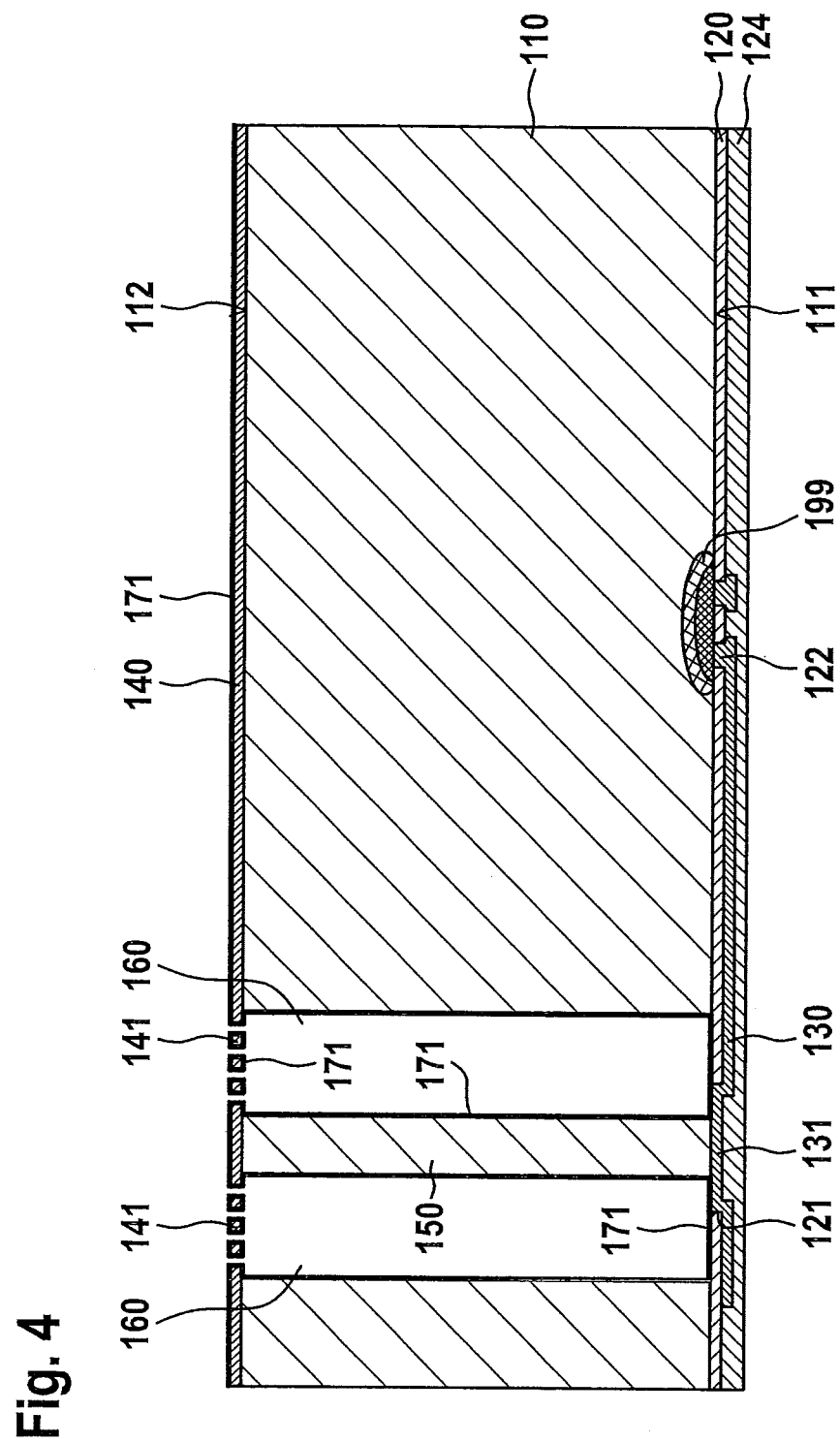

To form diffusion barrier layer 171, which is produced both outside of trench structure 160 in the area of substrate top side 112 and within trench structure 160, as illustrated in FIG. 4, chemical vapor deposition (CVD) may be carried out, for example. In this process, diffusion barrier layer 171 is deposited on masking layer 140, including the webs of lattice structure 141, in substrate area 150 (or on an exposed circumferential side wall of the same), on a section of substrate 110 which is opposite substrate area 150 and encloses substrate area 150, and in the (previously) exposed subareas of insulating layer 120 and contact surface 131 in the area of substrate bottom side 111. In this process, lattice structure 141 is not closed off to be able to introduce a volatile starting material into trench structure 160 for insulating layer 172 to be subsequently produced. This may be achieved by an appropriate or relatively small layer thickness of diffusion barrier layer 171. Diffusion barrier layer 171 is formed with regard to a metallic material 180 used at a later method stage to prevent the same from diffusing outward. A material which may be considered for this purpose for diffusion barrier layer 171 is silicon nitride, for example.

Figure 5:
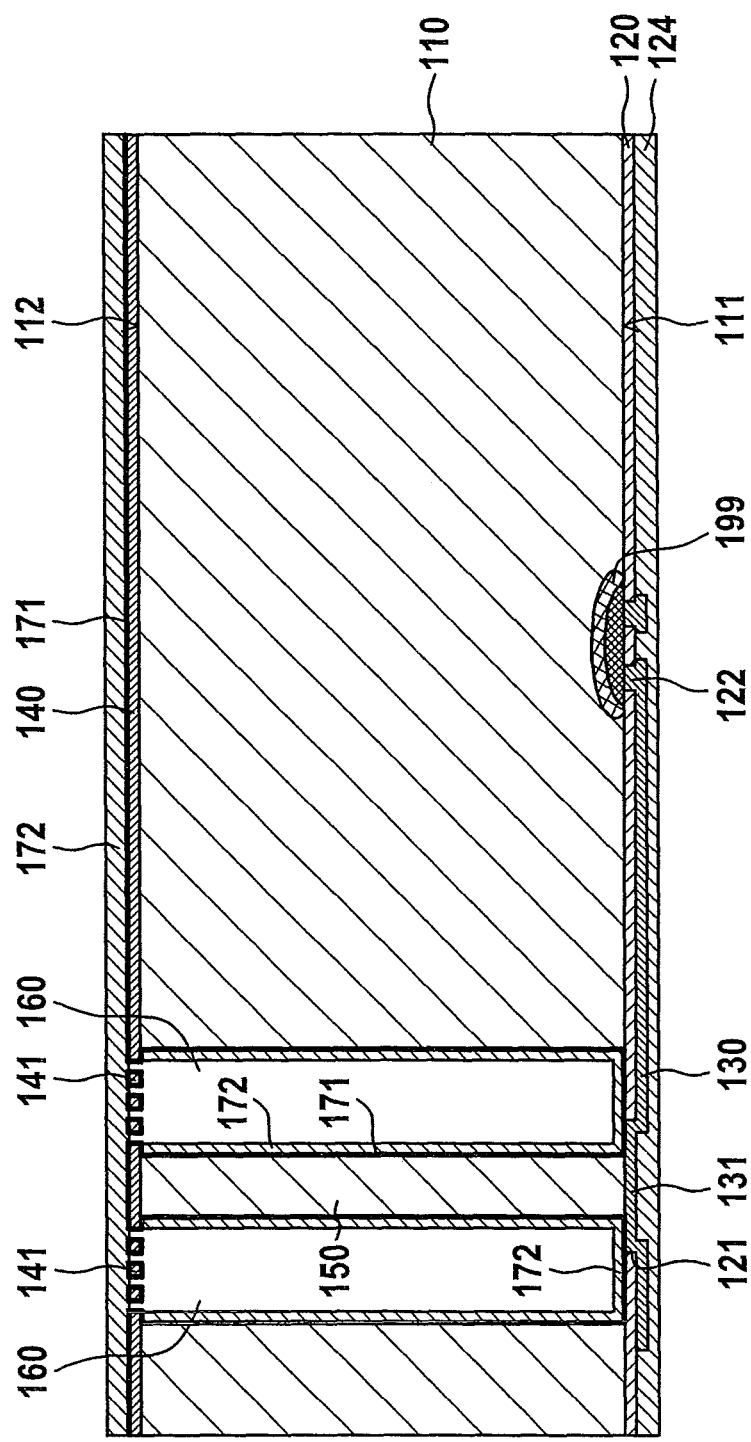

For the subsequently carried-out formation of insulating layer 172, which is produced, as shown in FIG. 5, on diffusion barrier layer 171 outside of trench structure 160 or in the area of substrate top side 112 as well as within trench structure 160, a CVD process may also be carried out. Insulating layer 172 may, in particular, be a silicon oxide layer which is formed within the scope of the so-called TEOS deposition process using tetraethylorthosilicate (TEOS) as the starting material. Since lattice structure 141 is not (yet) closed off at the beginning of this process, insulating layer 172 may also be applied in the area of or within trench structure 160 as a contiguous layer. In the course of the deposition process, lattice structure 141 and thus trench structure 160 are closed off. In this way, a cavity, which is enclosed by layer 172 or by the two layers 171, 172, is present in the area of or within trench structure 160 which may provide electrical insulation and stress decoupling of the through-connection in later component 100. In deviation from the illustration in FIG. 5 (and in the following figures), deposited insulating layer 172 may also be formed in the holes between the webs of lattice structure 141 or in such a way that it encloses the webs of lattice structure 141.

As indicated above, trench structure 160 may have relatively large lateral dimensions and a relatively small aspect ratio. Such a design makes it possible that the closing layer or the two layers 171, 172 may be reliably formed in the area of trench structure 160, in particular in a "bottom area" of trench structure 161 (i.e., in the area of substrate bottom side 111). With regard to the formation of insulating layer 172, an (oxide) deposition, which is as compliant as possible, may, in particular, be enabled in this way having a relatively great layer thickness.

By inserting lattice structure 141, trench structure 160 is closed off not only via the two layers 171, 172 but additionally also via masking layer 140 or its lattice structure 141. In this way, trench structure 160 may be reliably closed off even in the case of provided, relatively large lateral dimensions of trench structure 160.

Figure 6:
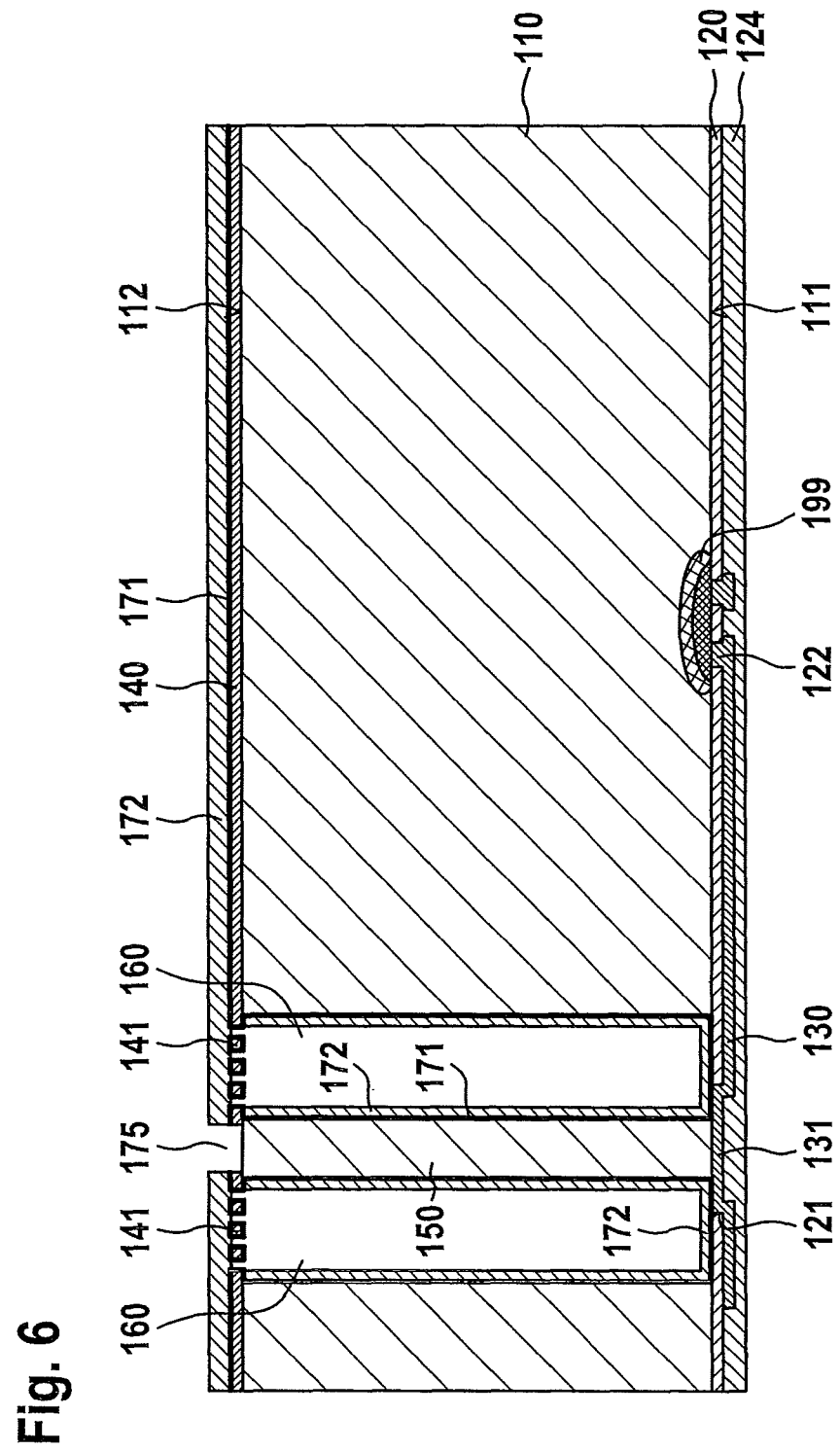
Figure 7:
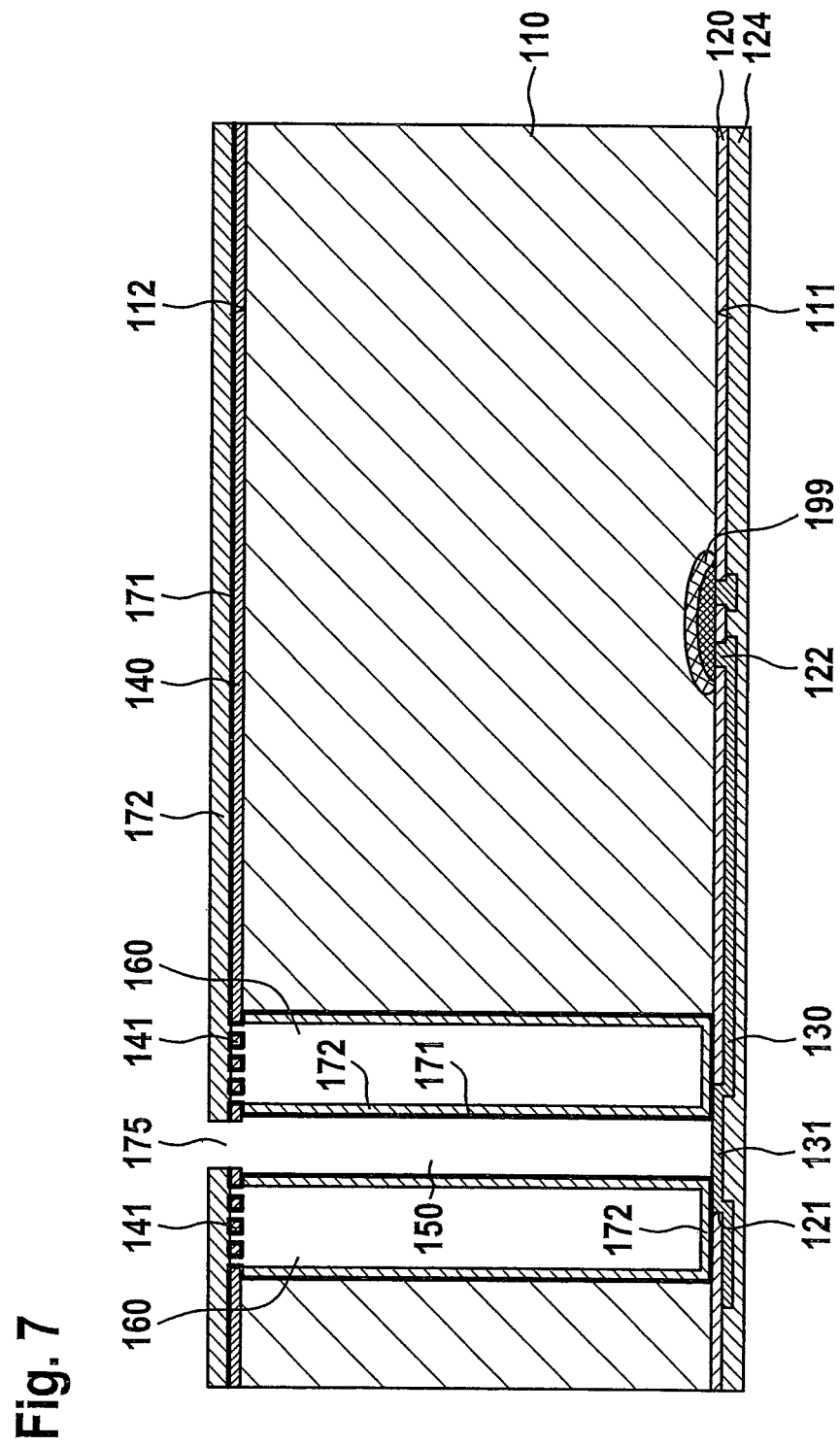

After closing off trench structure 160, substrate material (silicon) is removed from entire substrate area 150, which is enclosed by closed-off trench structure 160 and by the cavity, in another step 304 (cf. FIG. 11), which is explained with reference to FIGS. 6 and 7. For this purpose, an opening 175 is initially formed in the closing layer or the two layers 171, 172 and in masking layer 140, as shown in FIG. 6, in order to expose a subarea of substrate area 150 covered by these layers 140, 171, 172 on substrate top side 112. Opening 175 may, for example, be formed within the scope of a structuring and etching process using a photo-lacquer mask (not illustrated).

The actual removal of substrate material is carried out subsequently. As shown in FIG. 7, the substrate material is completely removed from entire substrate area 150, surrounded by trench structure 160, until contact surface 131 is reached so that substrate area 150 is now a "hollowed-out" substrate area 150 in the form of a recess surrounded by a trench structure 160 and the enclosed cavity ("hollow punch"). The substrate material is removed within the scope of an isotropic etching process using previously formed opening 175. During the etching process, the closing layer or layers 171, 172 (as well as a small portion of masking layer 140) may be used as an etch stop, whereby the substrate material is only removed from substrate area 150 surrounded by trench structure 160. Furthermore, metallic contact surface 131 may be used as an etch stopping layer where the etching process may be reliably stopped.

To remove the substrate material, a preferably chemical etching process without plasma support is carried out, e.g., etching using ClF3. In this way, a great etching selectivity may be achieved with regard to layers 140, 171, 172 or their materials (silicon oxide and silicon nitride) and with regard to metallic contact surface 131. It is also possible to reliably remove the substrate material from substrate area 150 which is (preferably) designed to have a great aspect ratio.

Figure 8:
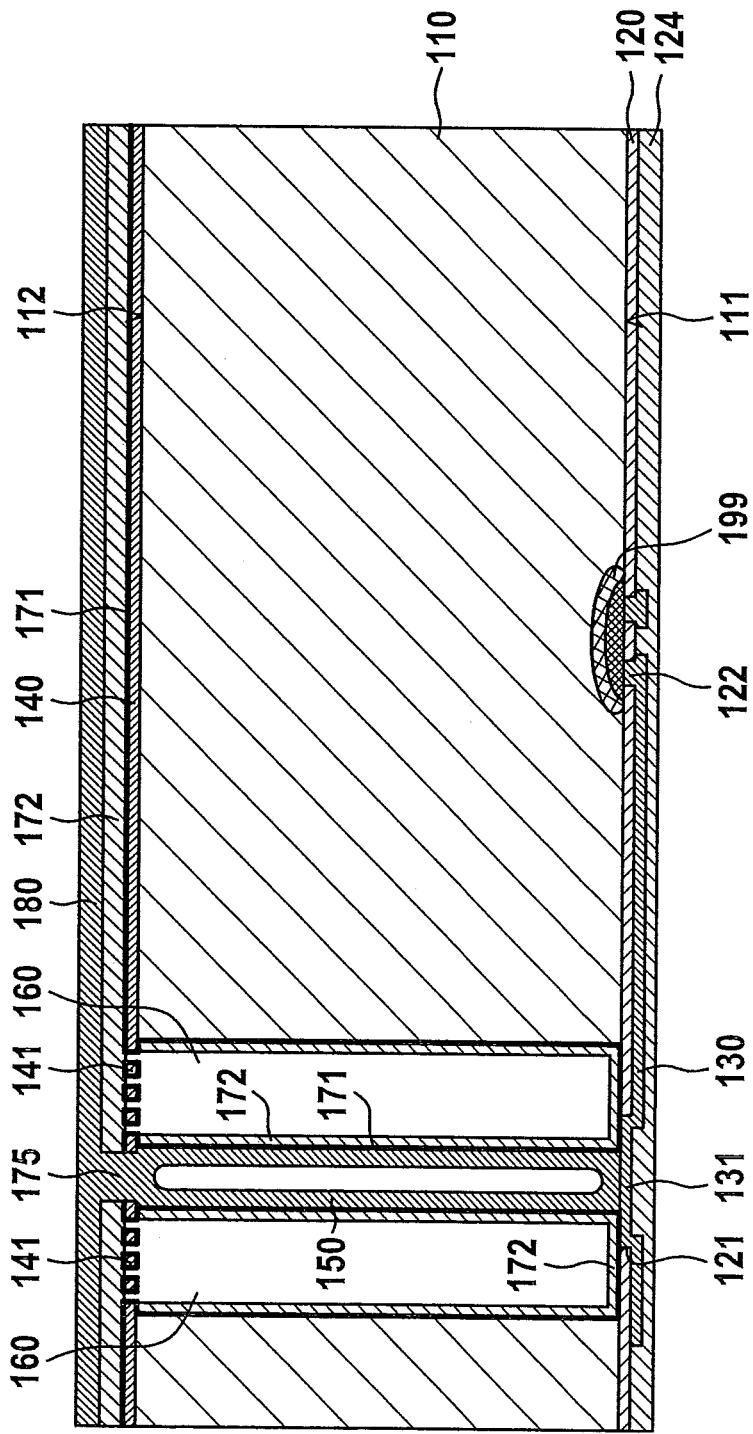

Subsequently, a metallic material 180 is applied to substrate 110 in a step 305 (cf. FIG. 11) to metallically fill hollowed-out substrate area 150. Here, it is in particular provided that substrate area 150 (including opening 175 produced in layers 140, 171, 172) is entirely filled metallically, i.e., up to the surface across the entire length or height, as shown in FIG. 8. It is possible, as indicated in FIG. 8, that substrate area 150 is filled up in such a way that a cavity enclosed in metallic material 180 may be present. Metallic material 180, which may contact contact surface 131 within substrate area 150, is also formed on the closing layer or layer 172 outside of substrate area 150. Due to the complete filling, metallic material 180 has a generally planar surface which is favorable for the further processing of substrate 110. Depending on used metallic material 180, it may be provided, if necessary, that prior to the application of metallic material 180, an additional conductive diffusion barrier layer, e.g., made of titanium nitride, is applied which is, in particular, introduced into hollowed-out substrate area 150. In this way, metallic material 180 and contact surface 131 are not interconnected directly but via the conductive diffusion barrier layer (not illustrated).

Tungsten may be used as metallic material 180, for example, which is deposited within the scope of a CVD process. Due to the great aspect ratio of "hollow punch" 150, the filling up may be carried out using this method cost-effectively and in a relatively short period of time. This is also possible in the case of a relatively great thickness of substrate 110 (and thus height of substrate area 150).

The carrying out of a tungsten CVD process may be associated with relatively high temperatures. To prevent this and to subject substrate 110 to smaller temperature fluctuations, other processes for metallic filling may alternatively be carried out. It is, for example, possible to apply metallic material 180 within the scope of an electroplating process. In this regard, copper, which has a low ohmic resistance, may be considered for metallic material 180 used. Prior to the actual electroplating process, the deposition of a starting layer may be carried out.

Figure 9:
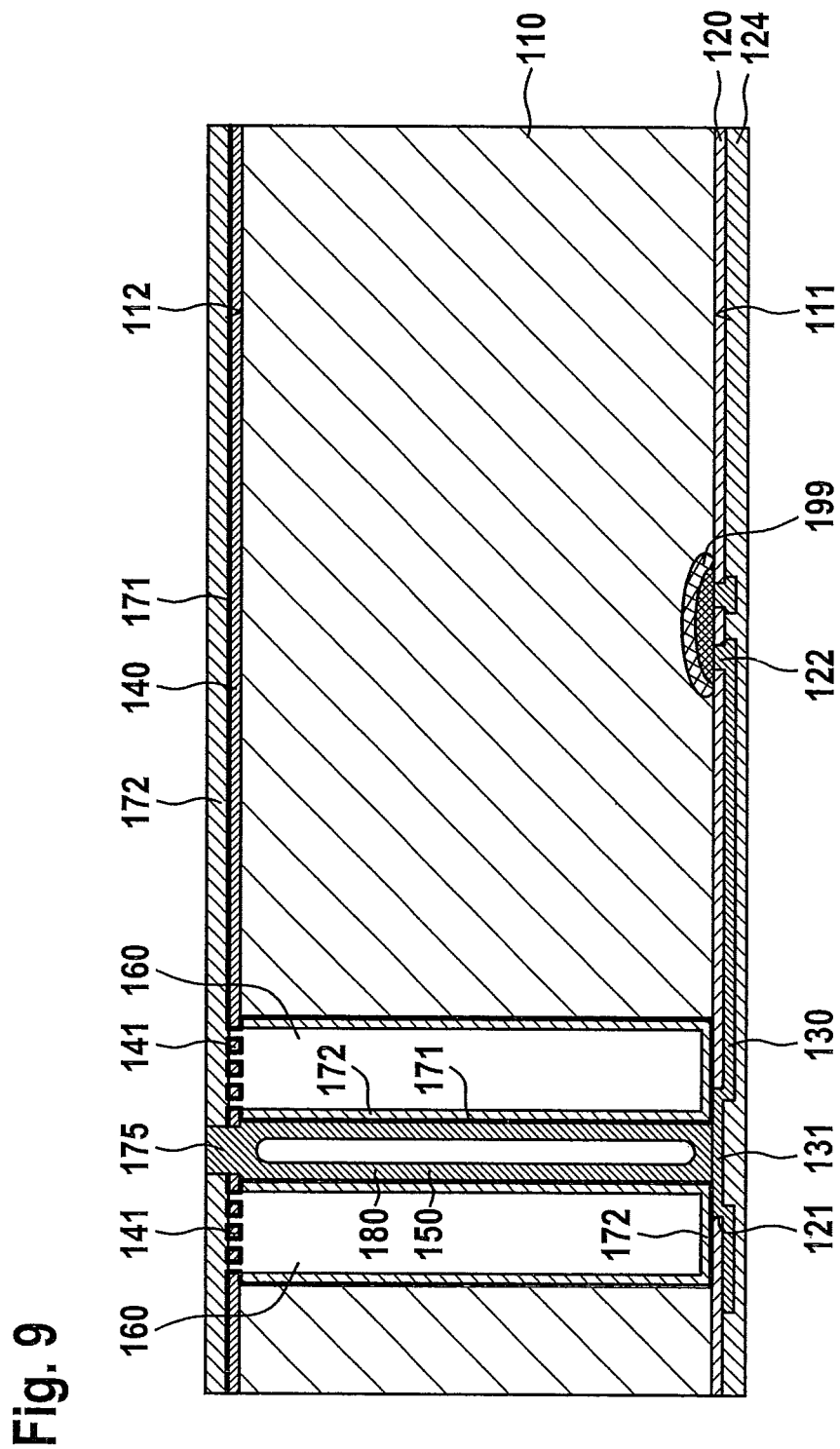

Subsequently, additional processes are carried out to complete the manufacture of component 100. These processes are combined in another step 306 in the flow chart of FIG. 11. These processes include partially removing metallic material 180 so that the closing layer or layer 172 is again exposed on its top side, as illustrated in FIG. 9. In this way, metallic material 180 only remains in substrate area 150 (and in opening 175 assigned to substrate area 150) so that a "metal punch" is present. Metallic material 180 may, for example, be removed with the aid of a CMP (chemical mechanical polishing) process.

Subsequently, additional structures may be formed on substrate 110 in the area of substrate top side 112. Component 100 shown in FIG. 10 has, for example, a rewiring plane or printed conductor plane, which is connected to metallic material 180, in the form of a (structured) conductive layer 190 (for example, made of a metallic material). On layer 190, but also on layer 172, another insulating layer 195 is formed which has an opening 196 via which layer 190 is partially exposed. Layer 195 which is (also) used for passivation may be a silicon nitride layer or a silicon oxide layer, for example.

Within the scope of step 306, additional processes may furthermore be carried out to form, for example, additional structures and/or layers or functional layers on substrate 110 (not illustrated). Furthermore, carrying out separation processes to separate component 100 may also be considered.

Figure 10:
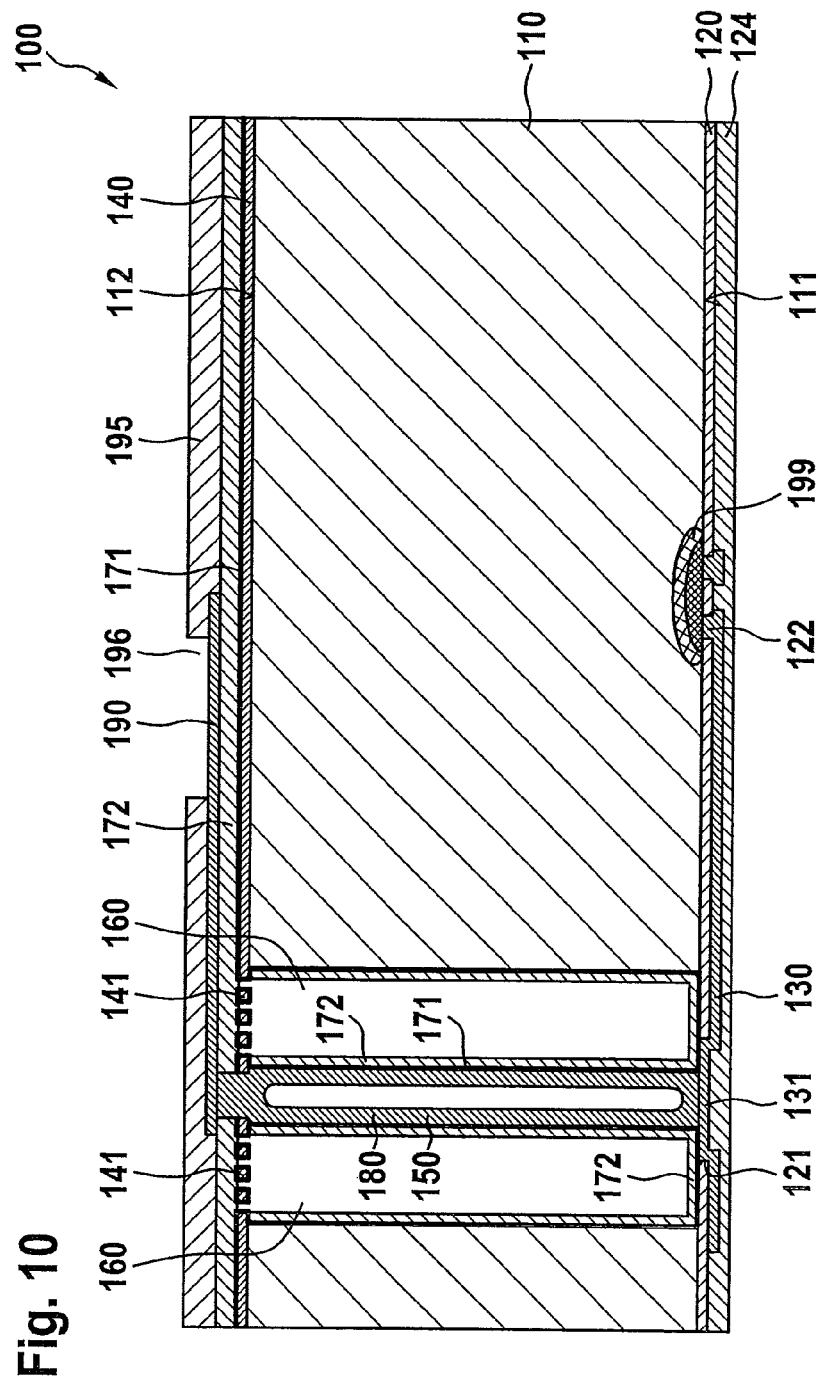

In component 100 of FIG. 10, metallic material 180 introduced into hollowed-out substrate area 150 forms the conductive integral part of a through-connection with the aid of which transistor 199 situated on substrate bottom side 111 may be contacted in the area of substrate top side 112 via conductive layer 190. In this case, conductive layer 190 is electrically connected to conductive layer 130 or its contact surface 131 via metallically filled substrate area 150 and further to transistor 199 via conductive layer 130. The cavity, which is situated in the area of trench structure 160 and delimited by the closing layer or layers 171, 172, and which surrounds metallically filled substrate area 150, enables both a reliable electrical insulation and a mechanical decoupling of metallically filled substrate area 150 from surrounding substrate 110. In this way, the occurrence of temperature-induced mechanical stresses in substrate 110, caused by differing thermal expansion coefficients of metallic material 180 and surrounding substrate material (silicon), is prevented. The provision of large lateral dimensions for trench structure 160 furthermore results in the electrical insulation implemented via trench structure 160 and the cavity present there having a relatively great thickness and consequently in the through-connection having a relatively small parasitic capacitance. Furthermore, the example method offers the advantage that layers 171, 172 may be formed independently of the aspect ratio of substrate area 150, as described above. Also, contact surface 131 provided in the area of insulating layer 120 allows a "lower" or "bottom-side" contact section of the through-connection to be formed independently of the aspect ratio of substrate area 150.

The example method described with reference to FIGS. 1 through 10 may be modified in such a way that only a single layer is formed instead of the two layers 171, 172. Similarly, such a layer may be applied after the trench etching both outside of trench structure 160 in the area of substrate top side 112 and within trench structure 160 in order to close off lattice structure 141 and consequently trench structure 160 and thereby to form an enclosed cavity in the area of trench structure 160. It is, for example, possible to apply only one layer used for insulation depending on metallic material 180 used. Furthermore, it is possible to form an insulating layer as the closing layer which simultaneously functions as the diffusion barrier.

The process sequence shown in FIGS. 1 through 10 is not only limited to integrated circuits, but may rather be similarly used with other substrates or components. Micromechanical components may, in particular, be considered. In this regard, it is possible, for example, that component 100 represents a micromechanical pressure sensor, structure 199 not being a transistor but a piezoelectric read-out structure 199. For this purpose, substrate 110 may additionally be provided with a cavity (cavern) situated in the area of read-out structure 199, whereby a pressure-sensitive diaphragm is present on substrate bottom side 111 (not illustrated). In such a component 100, which may otherwise also be designed in the manner described with reference to FIGS. 1 through 10, different pressures acting on the diaphragm may lead to different deformations of the diaphragm, which may be detected via piezoelectric read-out structure 199. Here, too, the through-connection implemented in the form of metallically filled substrate area 150 offers the possibility of contacting read-out structure 199 situated on substrate bottom side 111 via conductive layer 190 provided in the area of substrate top side 112.

Forming a through-connection may be considered not only for individual substrates but also for systems made of multiple substrates or partial substrates which are situated on top of one another; this system is also referred to as a substrate stack or "wafer stack." In this case, it may be similarly provided to etch a trench structure surrounding a substrate area into a subarea of the substrate stack or into one of the substrates, to close off the trench structure with a closing layer, forming an enclosed cavity, to remove substrate material from the substrate area surrounded by the closed-off trench structure, and to metallically fill the substrate area.

Figure 11:
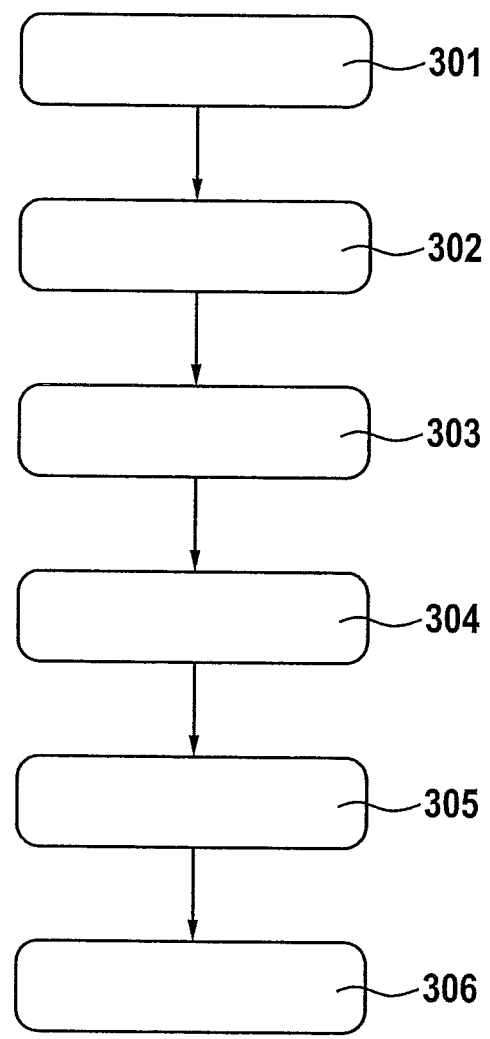
FIG. 11 shows an associated flow chart of a method for manufacturing a component having a through-connection.

A method carried out in this regard for manufacturing a micromechanical component 101 having a through-connection is described in greater detail in the following with reference to FIGS. 12 through 20. Component 101 may be a micromechanical acceleration sensor, for example. It is pointed out here that reference should be made to the preceding statements with regard to already described details which relate to identical or coinciding components, usable materials and method steps, possible advantages, etc. Furthermore, the flow chart of FIG. 11 is also used as reference here.

Figure 12:
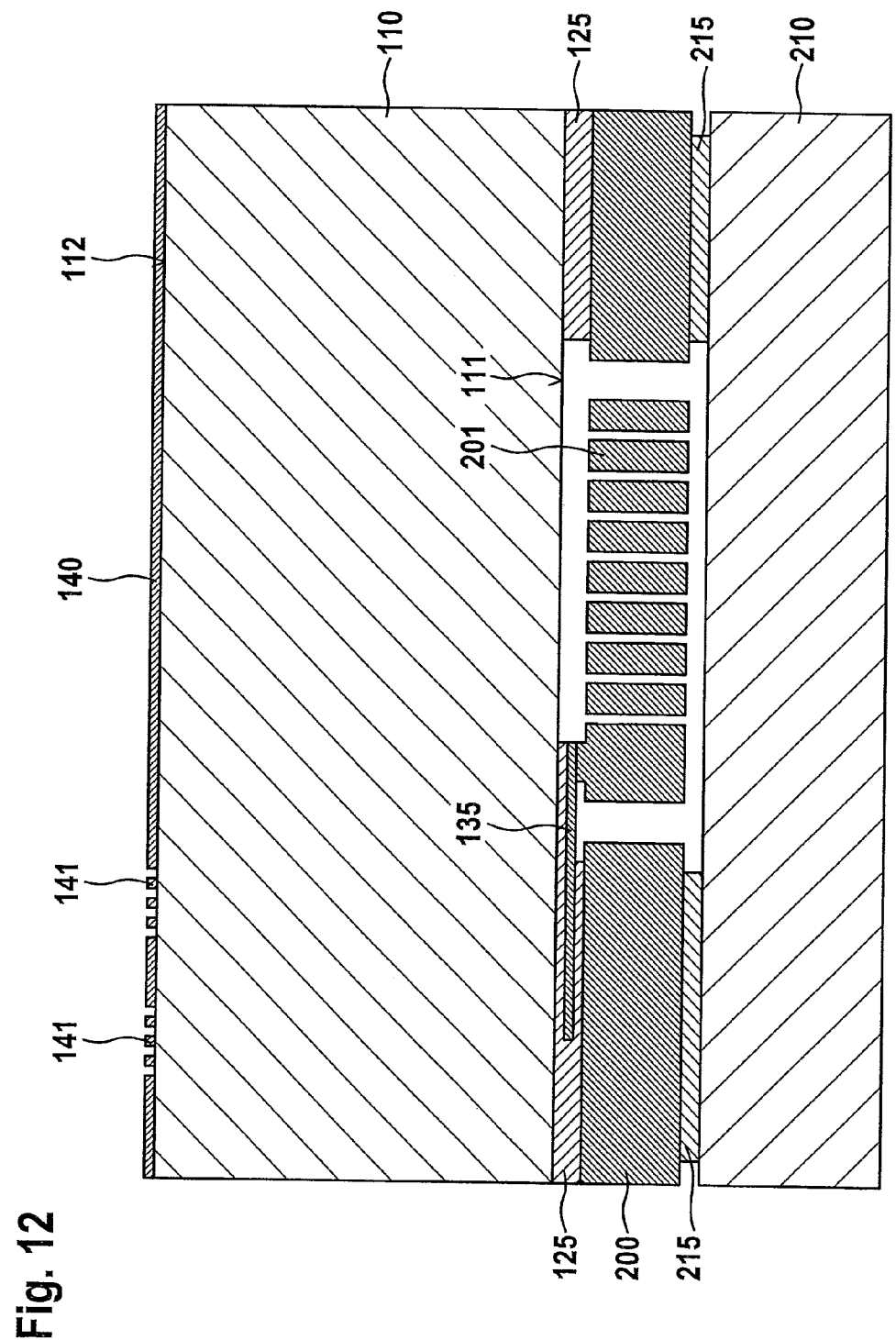
FIGS. 12 through 20 show the manufacture of another component having a through-connection, each in a schematic lateral sectional illustration.

At the beginning of the method, a substrate system is provided in a step 301 (cf. FIG. 11) which is shown only sectionally in FIGS. 12 through 20. The provided substrate system includes, as shown in FIG. 12, a substrate 110, on whose bottom side 111 a system made of a structured insulating layer 125 and a structured conductive layer 135 are provided, conductive layer 135 being partially embedded or buried in insulating layer 125. Substrate 110 may, in particular, be a silicon wafer. Insulating layer 125 may have silicon oxide, for example, and conductive layer 135 may have doped (poly) silicon or doped germanium, for example.

Adjoining insulating layer 125, a conductive functional layer 200 is furthermore provided on substrate 110 in the area of substrate bottom side 111. Functional layer 200 is, for example, a so-called epipolysilicon layer, i.e., a polycrystalline silicon layer produced in an epitaxy process which may optionally be doped. Functional layer 200 is formed in a subarea in the form of an exposed micromechanical structure 201 (microstructure or MEMS structure) having movable functional elements. In this case, an edge of micromechanical structure 201 or a portion thereof is contacted by conductive layer 135.

The provided substrate system furthermore has another substrate 210 which is connected to functional layer 200 via a connecting layer 215. The other substrate 210, which includes silicon, for example, represents a cap substrate or a cap wafer, with the aid of which micromechanical structure 201 may be hermetically sealed.

After providing the substrate system, a trench structure 160 which (vertically) extends through substrate 110 is formed in another step 302 (cf. FIG. 11). For this purpose, a partially perforated masking layer 140 which is made of silicon oxide, for example, and which has a lattice structure 141 is initially formed, as illustrated in FIG. 12, on top side 112 of substrate 110 which is opposite to bottom side 111. Lattice structure 141, which predefines a trench etching area and thus the lateral shape of trench structure 160, has a circumferential closed shape in the top view, e.g., is rectangular or ring-shaped.

Figure 13:
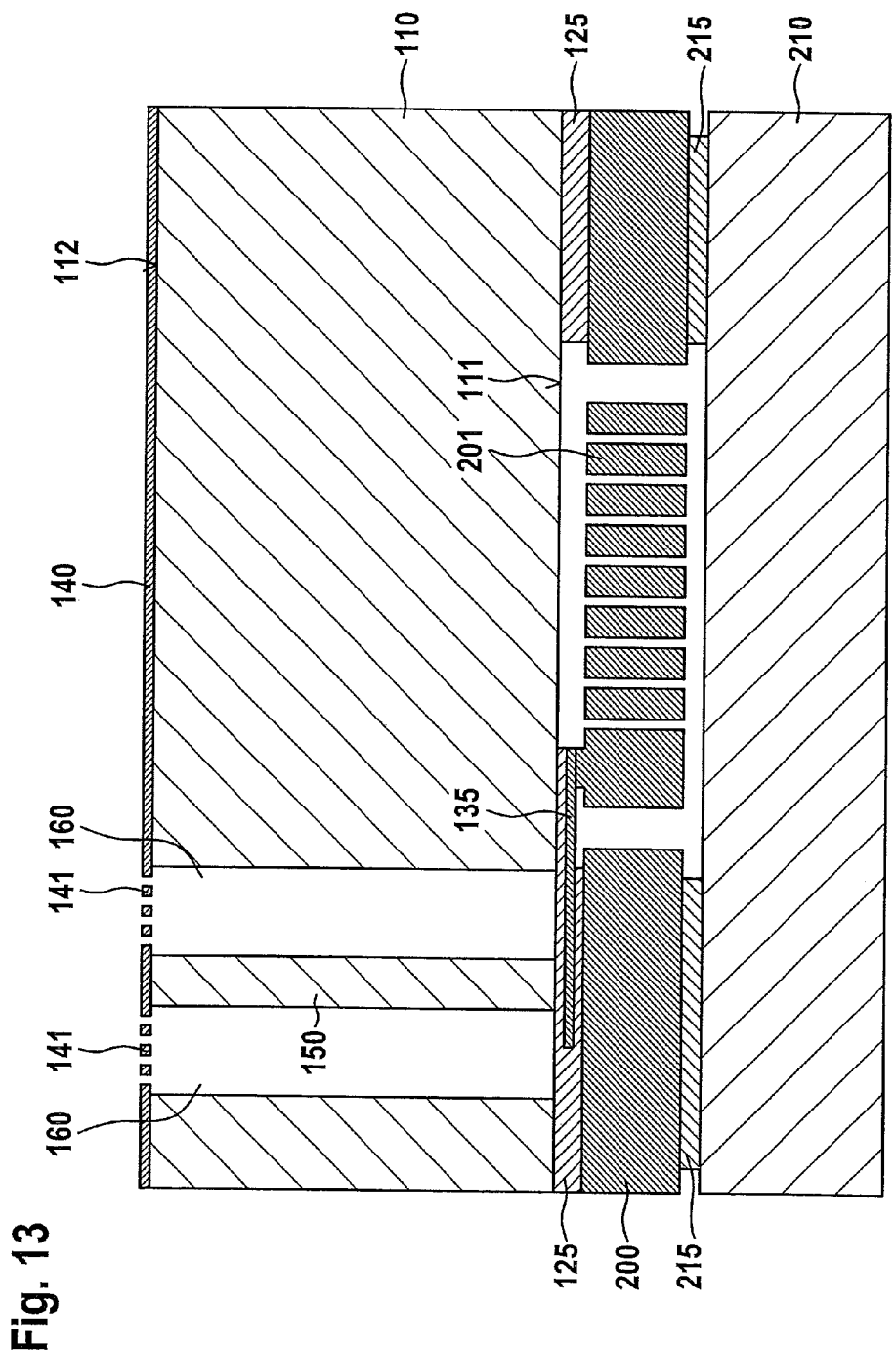

Using masking layer 140, an anisotropic etching process (in particular a DRIE process) is subsequently carried out, whereby substrate material is removed and trench structure 160 illustrated in FIG. 13 and covered by masking layer 140 is produced in substrate 110. During the trench etching process, in which lattice structure 141 is completely undercut and a substrate area 150 which is completely surrounded by trench structure 160 is formed, insulating layer 125 situated on substrate bottom side 111 is used as an etch stopping layer where the etching process may be reliably stopped. Substrate area 150 is situated above a section of conductive layer 135 which is implementable with the aid of an appropriate design or position of lattice structure 141 with regard to layer 135. Substrate area 150 is preferably designed to have a relatively great aspect ratio and trench structure 160, in contrast to that, to have a relatively small aspect ratio.

Figure 14:
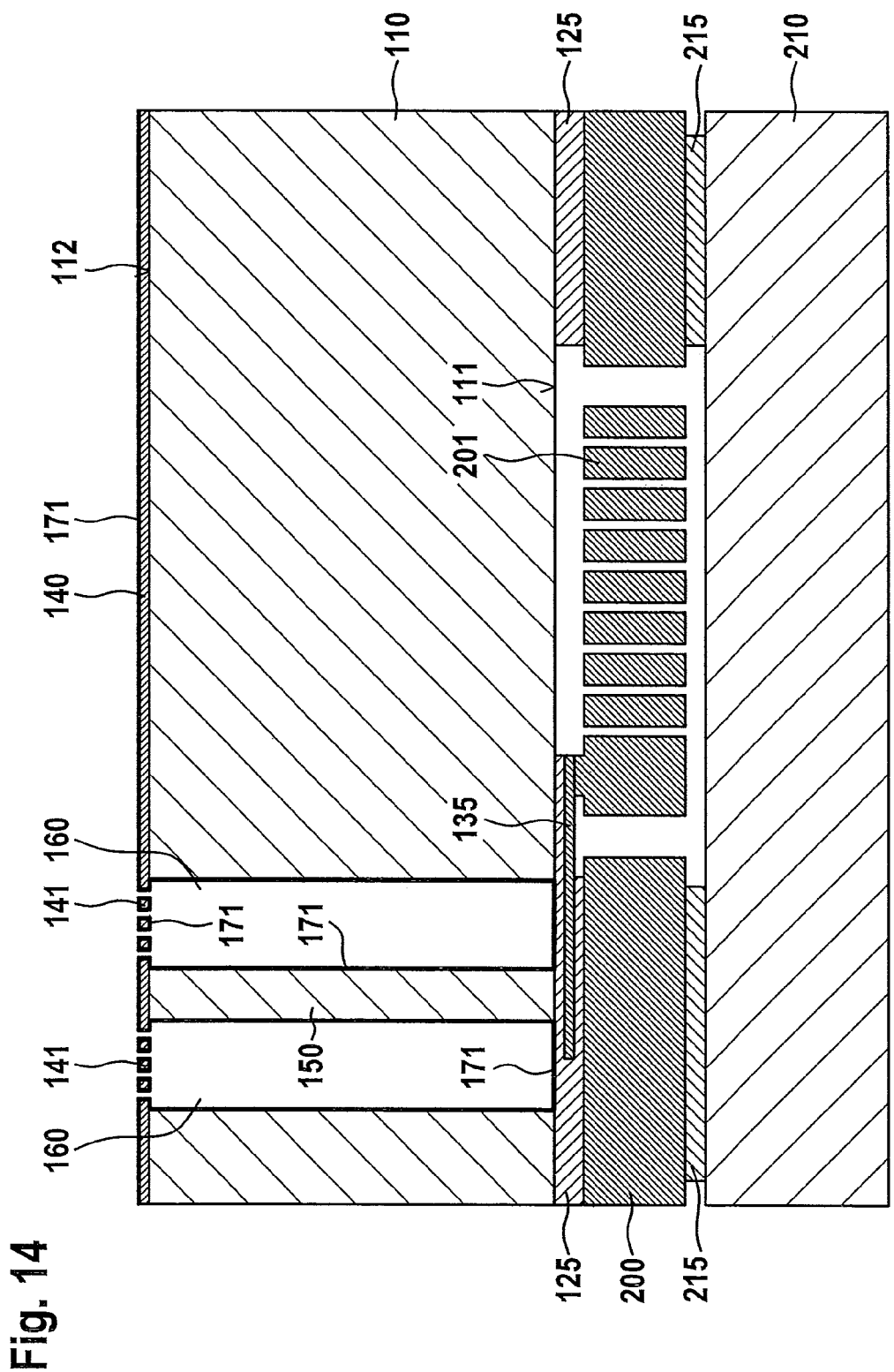
Figure 15:
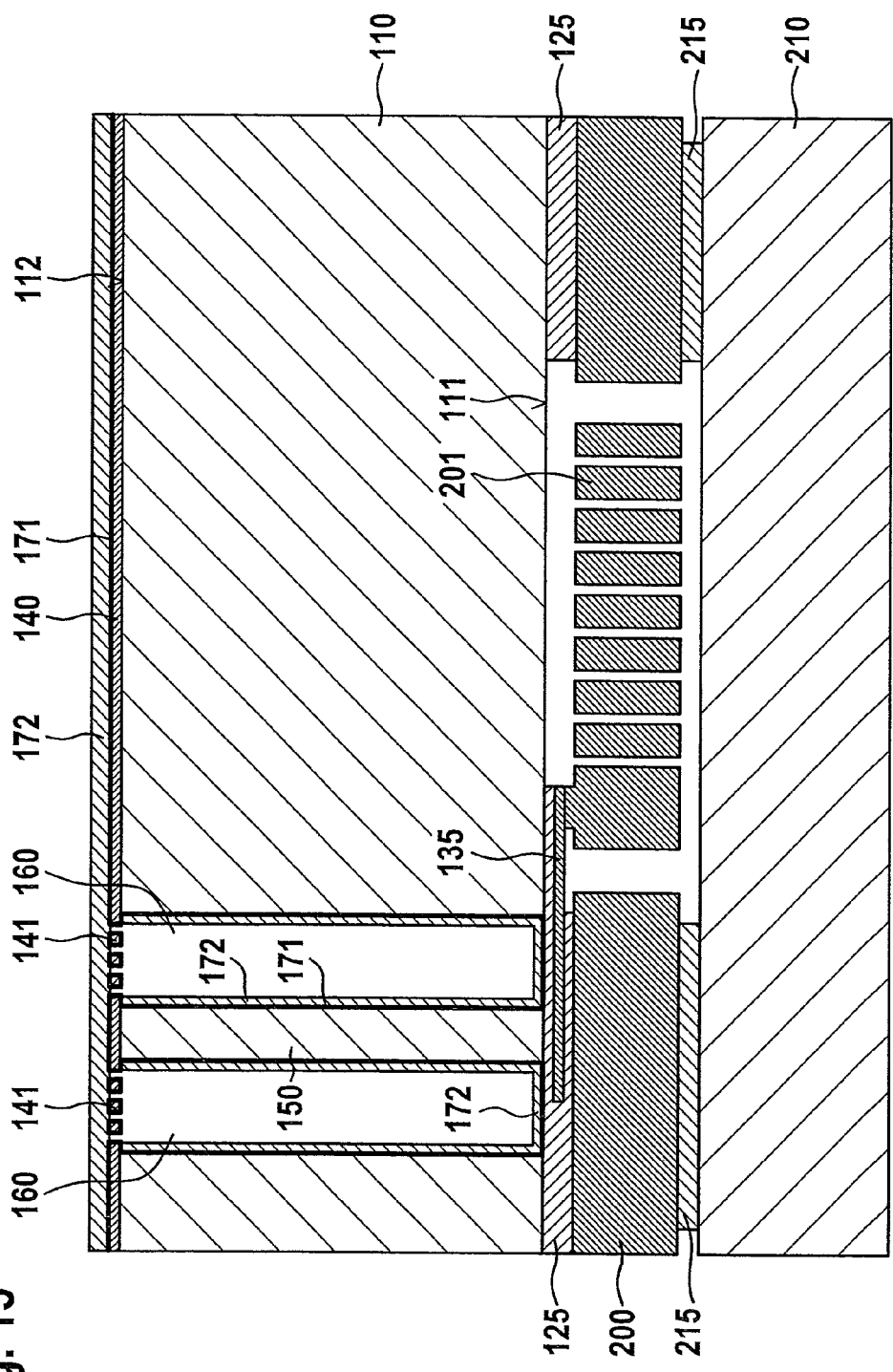

In a subsequent step 303 (cf. FIG. 11), trench structure 160 is closed off and a girded cavity is thus formed. For this purpose, it is provided to initially deposit a diffusion barrier layer 171 outside of trench structure 160 in the area of substrate top side 112 and within trench structure 160, as shown in FIG. 14, and to subsequently form an insulating layer 172 on diffusion barrier layer 171 outside of and within trench structure 160, as illustrated in FIG. 15. Diffusion barrier layer 171 may, for example, include silicon nitride, and insulating layer 172 may, for example, include silicon oxide. As in the process sequence of FIGS. 1 through 10, it may also be provided here to deposit only a single layer instead of the two layers 171, 172.

Figure 16:
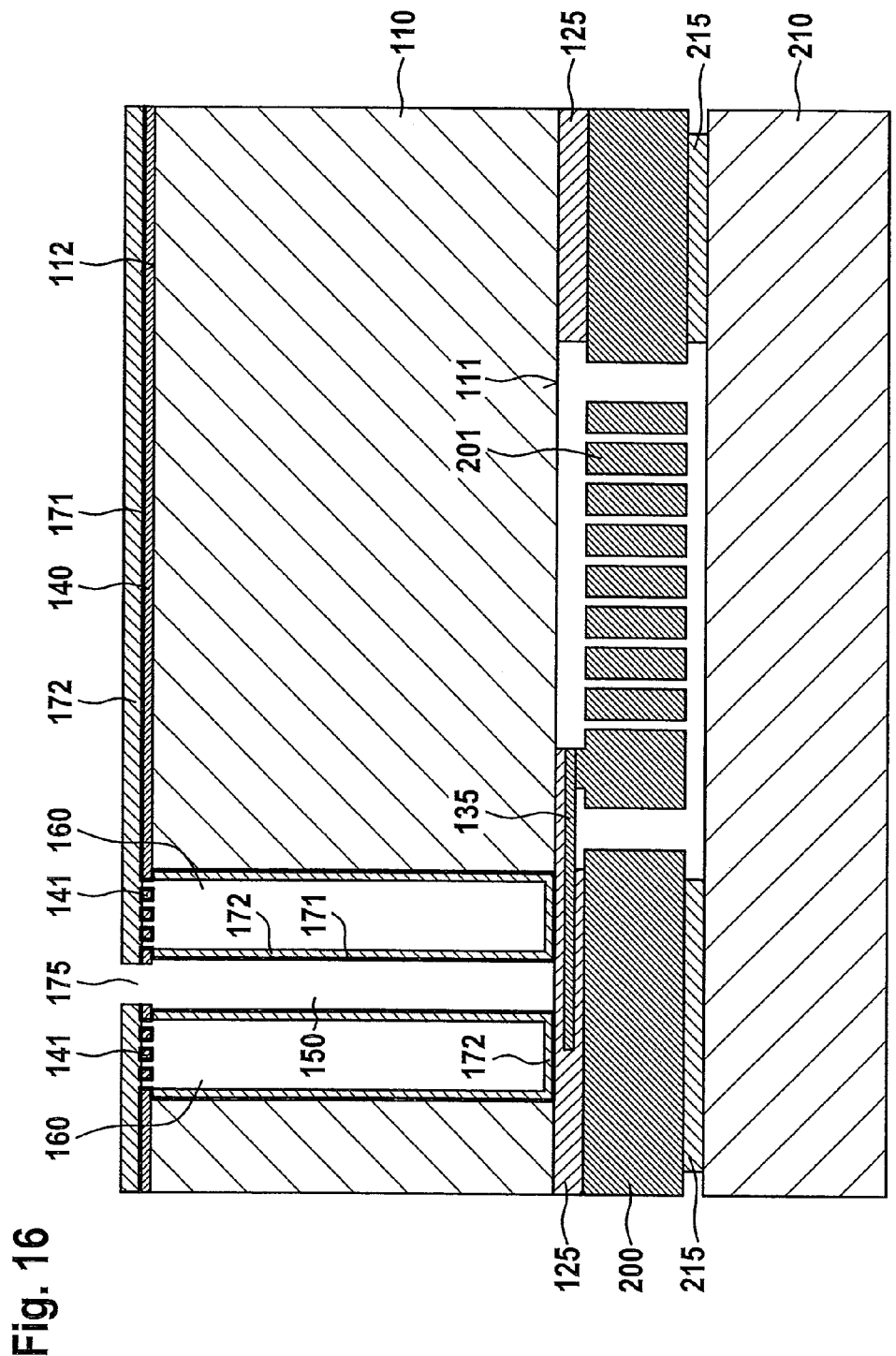

Subsequently, substrate material is removed from substrate area 150 in a step 304 (cf. FIG. 11). For this purpose, an opening 175 is initially formed in layers 171, 172 and in masking layer 140, and substrate area 150 is subsequently completely hollowed out using opening 175 until insulating layer 125 is reached within the scope of an isotropic etching process, as illustrated in FIG. 16. During the etching process, layers 171, 172 (as well as a small portion of masking layer 140) may be used as an etch stop. Furthermore, insulating layer 125 may be used as an etch stopping layer where the etching process may be reliably stopped. In this regard, conductive layer 135 may, in particular, also be protected against an etching attack. To remove the substrate material, a chemical etching process without plasma support is preferably carried out again, e.g., etching using CIF3, whereby a great etching selectivity may be achieved with regard to layers 140, 171, 172 as well as with regard to insulating layer 125 (silicon oxide).

Figure 17:
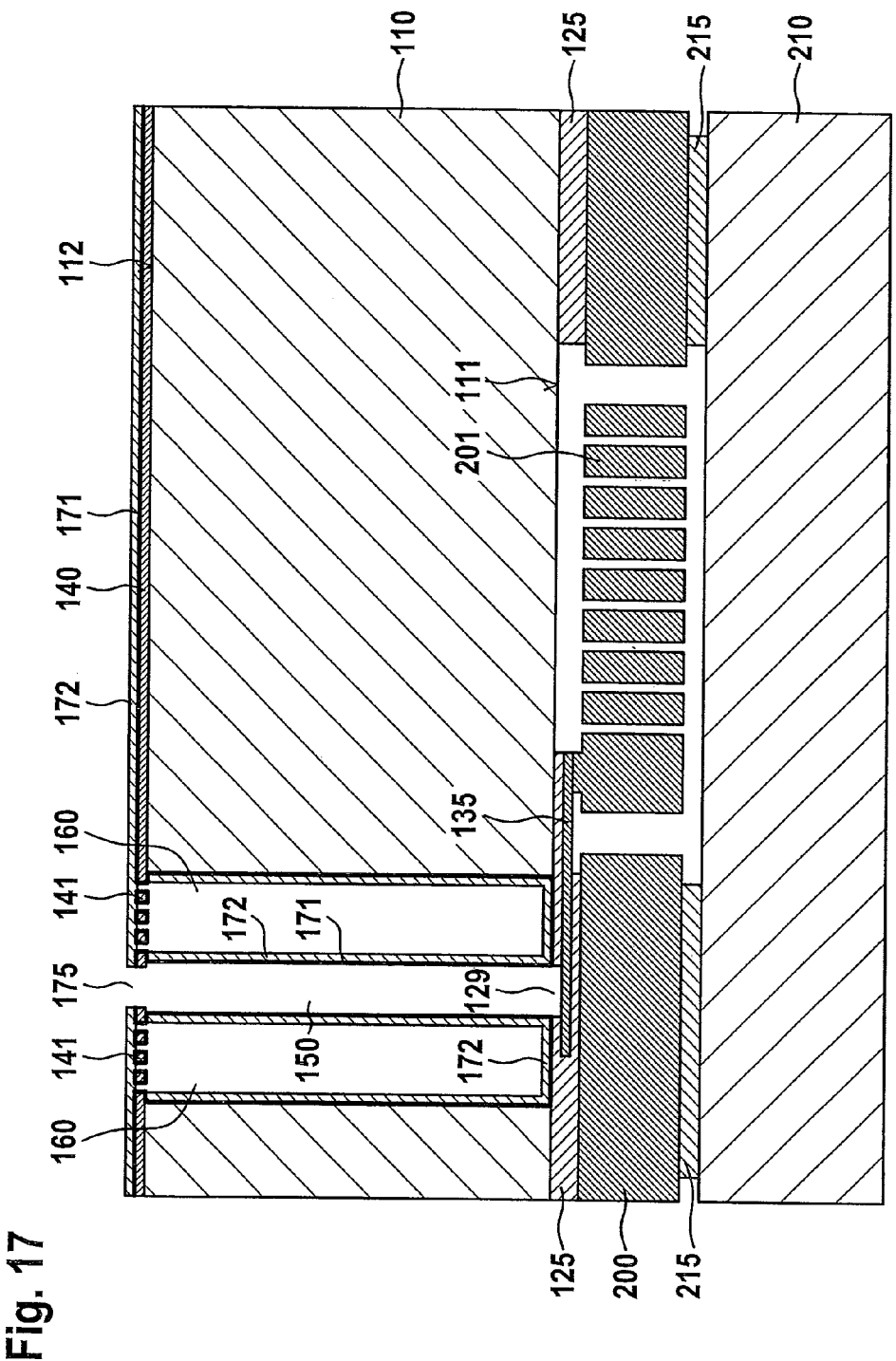

Prior to the metallic filling of hollowed-out substrate area 150, a portion of insulating layer 125 is furthermore removed during an additional process which may be attributed to step 304. In this way, an opening 129 is formed, as shown in FIG. 17, via which conductive layer 135 is exposed on substrate bottom side 111 in the area of substrate area 150. The exposed area of conductive layer 135 may be used as the contact surface for the later through-connection. To partially remove insulating layer 125, a directed reactive ion etching process may be carried out, for example. In the course of this process, insulating layer 172 may be partially removed outside of substrate area 150 and thereby thinned.

Figure 18:
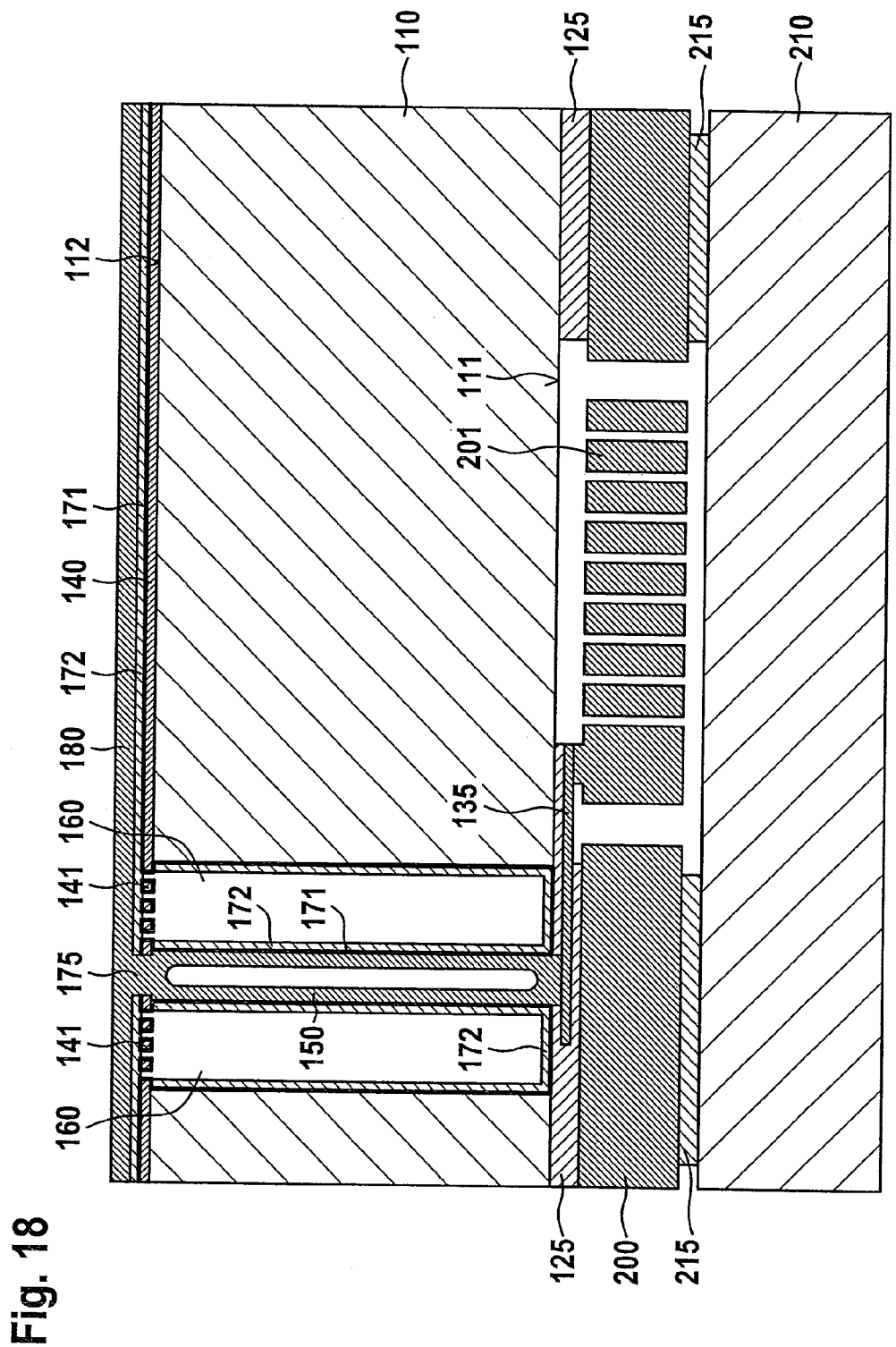

Subsequently, a metallic material 180 is applied to substrate 110 in a step 305 (cf. FIG. 11) to fill hollowed-out substrate area 150 with metallic material 180 preferably up to the surface, as shown in FIG. 18. Metallic material 180, which may contact conductive layer 135 within substrate area 150, is also formed on layer 172 outside of substrate area 150. Tungsten may be used as metallic material 180, for example, which is deposited using a CVD process. Alternatively, an electroplating process may also be carried out to deposit copper as metallic material 180, for example. Depending on metallic material 180 used, it may be provided, if necessary, that prior to the application of metallic material 180, an additional conductive diffusion barrier layer, made of titanium nitride, for example, is applied which is, in particular, introduced into hollowed-out substrate area 150. In this way, metallic material 180 and conductive layer 135 are not contacted directly but via the conductive diffusion barrier layer (not illustrated).

Figure 19:
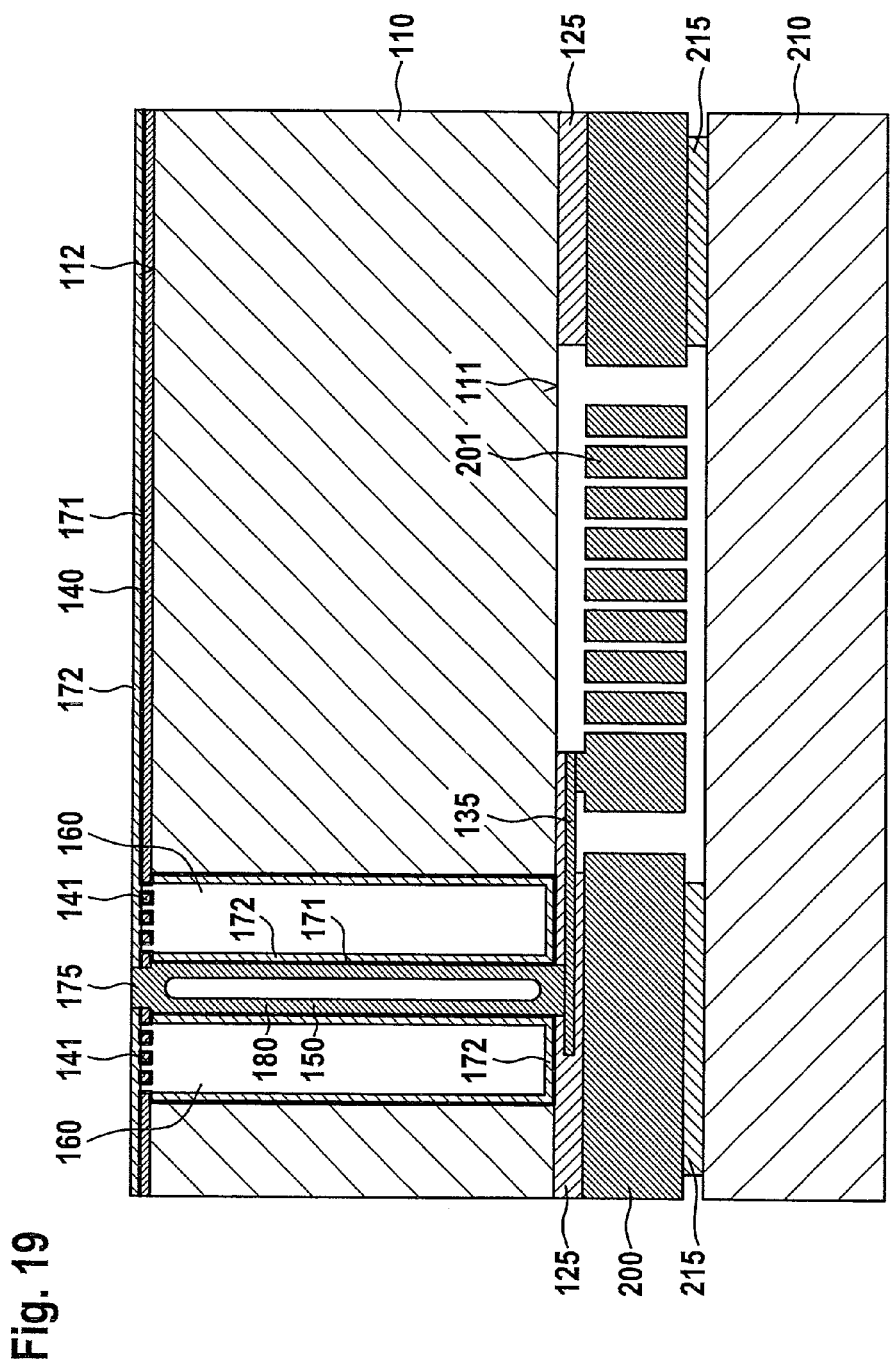
Figure 20:
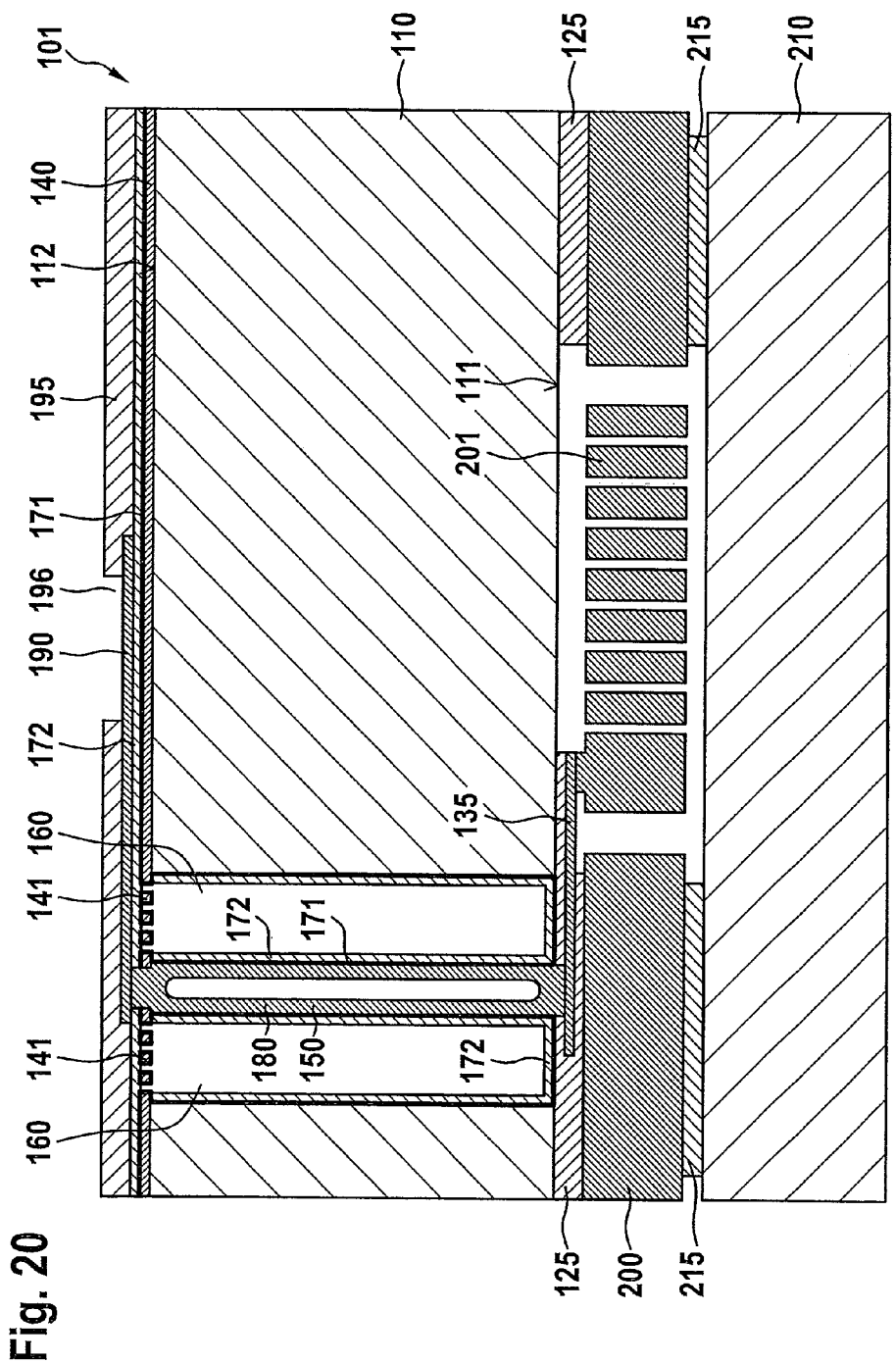

Subsequently, additional processes are carried out to complete component 101 which are combined in the flow chart of FIG. 11 in another step 306. These processes include removing metallic material 180 in such a way that the closing layer or layer 172 is exposed again on its top side, as illustrated in FIG. 19, and metallic material 180 is present only in the area of substrate area 150. Additional structures may also be formed on substrate 110 in the area of substrate top side 112. As shown in FIG. 20, it may be provided, for example, that component 101 is provided, comparably to component 100 of FIG. 10, with a conductive layer 190 used as the rewiring plane. Furthermore, an insulating layer 195, which includes an opening 196 partially exposing conductive layer 190, is formed on layer 190, but also on layer 172. Within the scope of step 306, additional processes may furthermore be carried out to form, for example, additional structures and/or layers on substrate 110 (not illustrated). A separation process may also take place to separate component 101.

In component 101 of FIG. 20, metallic material 180 introduced into hollowed-out substrate area 150 forms the conductive integral part of a through-connection with the aid of which micromechanical functional structure 201 provided in the area of substrate bottom side 111 may be contacted in the area of substrate top side 112 via conductive layer 190. In this case, conductive layer 190 is electrically connected to conductive layer 135 via metallically filled substrate area 150 and further to functional structure 201 via conductive layer 135. Electrical insulation and mechanical decoupling of metallically filled substrate area 150 are both implemented with regard to surrounding substrate 110 via the cavity present within trench structure 160. In component 101, in particular, which may represent a micromechanical acceleration sensor, a "wide" design of trench structure 160 and thus the cavity may prove advantageous. The great insulation thickness achieved in this way results in the through-connection, and thus an associated signal path, being subject to only a small parasitic capacitance.

Figure 21:
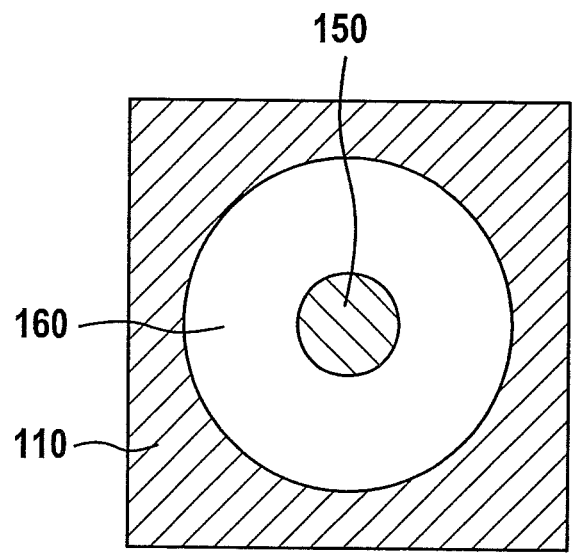
FIGS. 21 through 25 show schematically show possible embodiments of through-connections in a top view.

In components 100, 101 of FIGS. 10 and 20, but also in other, comparably constructed components, metallically filled substrate area 150 and surrounding trench structure 160 may have any shape in the top view. One possible structure having a round or circular substrate area 150 and a ring-shaped trench structure 160 ("insulation ring"), which is formed in substrate 110 and encloses substrate area 150, is shown in the top view of FIG. 21. For the sake of clarity, the illustration of other components and layers (in particular layers 140, 171, 172, 190, 195) was dispensed with in this case. However, other shapes are alternatively also possible. For example, a rectangular or a square shape, or also narrow stripes, may be considered for substrate area 150, whereby the associated through-connection may have a relatively low electrical resistance, if necessary. Trench structure 160 enclosing the substrate area and thus the cavity situated within trench structure 160 may also have any other geometry in the top view and may be present in the form of a rectangular or square frame, for example.

Based on the top view illustrations of FIGS. 22 through 25, other possible designs for a through-connection of a component are described which are manufacturable in the same way by carrying out the process steps described above. In these figures, only the structures of substrate areas and trenches are illustrated and other components and layers are omitted.

Figure 22:
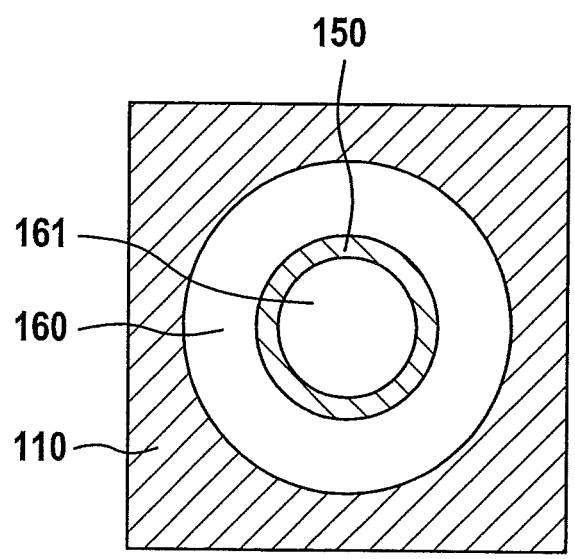

FIG. 22 shows another through-connection in which a substrate area 150 which is filled metallically and completely surrounded by a first trench structure 160 itself completely surrounds a second trench structure 161. As illustrated in FIG. 22, second or internal trench structure 161 may be circular and first or external trench structure 160 and substrate area 150 may be ring-shaped in this case. A through-connection constructed in this way may also have a relatively low electrical volume resistance.

The system of FIG. 22 may be produced by etching the two trench structures 160, 161 into a provided substrate 110 by carrying out an anisotropic etching process using an appropriately perforated masking layer (i.e., having a circular lattice structure for trench structure 161 and a ring-shaped lattice structure for trench structure 160 in the present case). Provided substrate 110 may, in particular, a design corresponding to FIG. 1 or be part of a substrate system corresponding to FIG. 12. By subsequently forming a closing layer (e.g., in the form of a diffusion barrier layer and an insulating layer), the two trench structures 160, 161 are closed off and a first cavity girded by the closing layer is formed in the area of (or within) first trench structure 160, and a second cavity girded by the closing layer is formed in the area of (or within) second trench structure 161. Subsequently, substrate material is removed from substrate area 150, a (ring-shaped) opening being initially formed in the masking layer and the closing layer in order to expose substrate area 150 on the substrate top side, and substrate area 150 subsequently being hollowed out using the opening within the scope of an isotropic etching process. In the case of an insulating layer which is present in the area of the substrate bottom side and in which a conductive layer is embedded (cf. FIG. 16 having layers 125, 135), an additional etching process is moreover carried out to expose the conductive layer in the area of substrate area 150. In the presence of a contact surface situated directly underneath substrate area 150, such a step may be omitted since the contact surface may already be exposed by the hollowing out of substrate area 150 (cf. FIG. 7 having contact surface 131). Subsequently thereto, substrate area 150 may be filled with a metallic material as described above and additional processes (removing the metallic material outside substrate area 150, forming additional structures or a rewiring plane, etc.) may be carried out.

Figure 23:
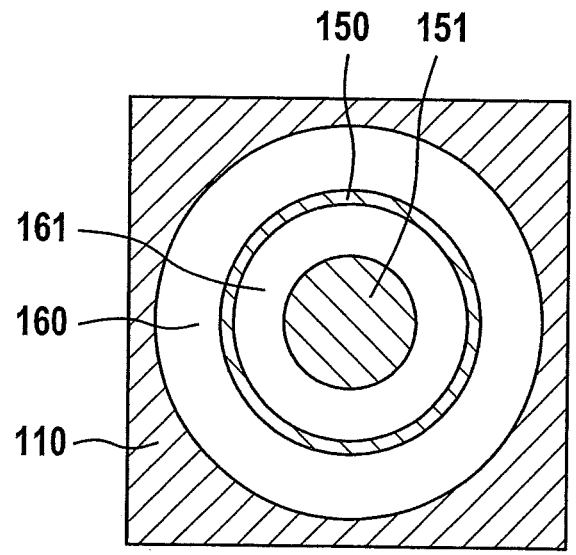

FIG. 23 shows another through-connection structure in which a first trench structure 160 completely surrounds a first metallically filled substrate area 150, substrate area 150 completely surrounds a second trench structure 161, and second trench structure 161 completely surrounds a second metallically filled substrate area 151. Second or internal metallic substrate area 151 is surrounded by first or external metallic substrate area 150 and is electrically insulated from first metallic substrate area 150 via second trench structure 161 (and the cavity present there). First metallic substrate area 150 is insulated and decoupled from surrounding substrate 110 via first trench structure 160 (and the cavity present there). As illustrated in FIG. 23, internal substrate area 151 may be circular and trench structures 160, 161 and external substrate area 150 may be ring-shaped. Such a nested design in which substrate areas 150, 151 may be used together in the form of a parallel circuit also enables a relatively low electrical volume resistance.

The system of FIG. 23 may be produced by etching the two trench structures 160, 161 into a provided substrate 110 by carrying out an anisotropic etching process using an appropriately perforated masking layer (i.e., having two ring-shaped lattice structures for trench structures 160, 161 in the present case). Provided substrate 110 may, again, have a design corresponding to FIG. 1 or be part of a substrate system corresponding to FIG. 12. By subsequently forming a closing layer (e.g., in the form of a diffusion barrier layer and an insulating layer), the two trench structures 160, 161 are closed off and a first cavity girded by the closing layer is formed in the area of (or within) first trench structure 160, and a second cavity girded by the closing layer is formed in the area of (or within) second trench structure 161. Subsequently, substrate material is removed from the two substrate areas 150, 151, two openings (i.e., one circular and one ring-shaped opening) being initially formed in the masking layer and the closing layer to expose substrate areas 150, 151 on the substrate top side, and substrate areas 150, 151 subsequently being hollowed out using the openings within the scope of an isotropic etching process. In the case of a contact surface extending directly underneath substrate areas 150, 151, the contact surface may be exposed as a result of the area of substrate areas 150, 151 being hollowed out. As long as an insulating layer having an embedded conductive layer is present in the area of the substrate bottom side, an additional etching process for exposing the conductive layer in the area of substrate areas 150, 151 may be carried out. Subsequently thereto, substrate areas 150, 151 may be filled by applying a metallic material as described above and additional processes (removing the metallic material outside of substrate areas 150, 151, forming additional structures or a rewiring plane, etc.) may be carried out.

Figure 24:
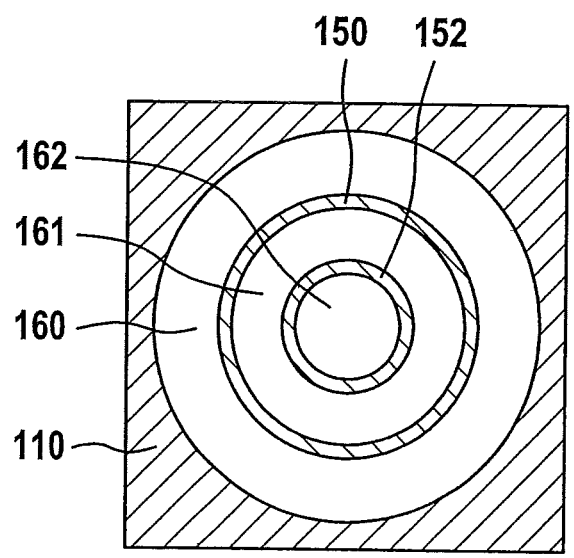

FIG. 24 shows a through-connection structure which may be construed as a modification or expansion of the structure of FIG. 23. An internal or second metallically filled substrate area 152, which is surrounded from the outside inwards by a first trench structure 160, a first metallic substrate area 150 and a second trench structure 161, itself encloses another or third trench structure 162. The individual components are again circular or ring-shaped. The manufacture of this structure may take place comparably to the method described with reference to FIG. 23, with now three trench structures 160, 161, 162 being etched and closed off and thus three enclosed cavities being formed within trench structures 160, 161, 162.

Furthermore, a through-connection may be constructed in such a way that multiple separate and metallically filled substrate areas are directly completely surrounded by a single or contiguous trench structure. In this case, the substrate areas are spaced apart from one another as well as "separated" from a surrounding substrate by the trench structure or the corresponding subareas of the trench structure.

Figure 25:
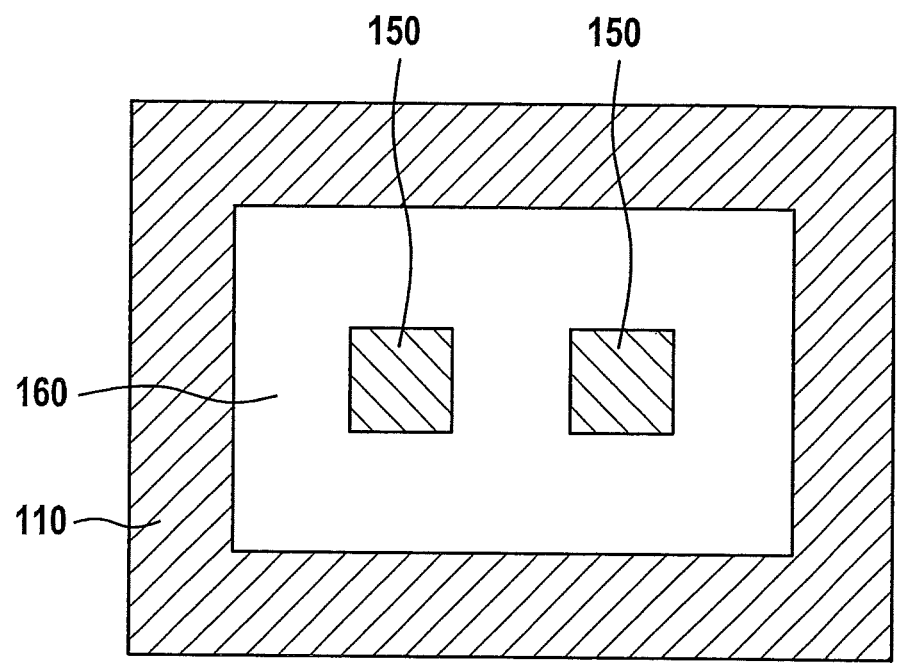

For exemplary illustration purposes, FIG. 25 shows another through-connection structure which includes a trench structure 160 formed in a substrate 110 and two metallically filled substrate areas 150 situated within trench structure 160. Substrate areas 150 are completely enclosed by trench structure 160. As shown in FIG. 25, trench structure 160 and substrate areas 150 may have rectangular contours, for example. Other geometries such as round or circular contours are, however, also possible. Substrate areas 150 may be used together in the form of a parallel circuit, thus achieving a relatively low electrical volume resistance.

The through-connection shown in FIG. 25 may be produced in that trench structure 160 is etched into a provided substrate 110 by carrying out an anisotropic etching process using an appropriately perforated masking layer. Provided substrate 110 may, again, have a design corresponding to FIG. 1 or be part of a substrate system corresponding to FIG. 12. By subsequently forming a closing layer (for example, in the form of a diffusion barrier layer and an insulating layer), trench structure 160 is closed off and a cavity girded by the closing layer is formed in the area of (or within) trench structure 160. The cavity may surround the two substrate areas 150 according to trench structure 160. Subsequently, substrate material is removed from the two substrate areas 150, corresponding openings being initially formed in the masking layer and the closing layer to expose substrate areas 150 on the substrate top side, and substrate areas 150 subsequently being hollowed out using the openings within the scope of an isotropic etching process. As long as a contact surface extending directly underneath substrate areas 150 is provided, the contact surface may be exposed as a result of the area of substrate areas 150 being hollowed out. In the case of an insulating layer having an embedded conductive layer in the area of the substrate bottom side, an additional etching process for exposing the conductive layer in the area of substrate areas 150 may be carried out. Subsequently thereto, substrate areas 150 may be filled by applying a metallic material as described above and additional processes (removing the metallic material outside of substrate areas 150, forming additional structures or a rewiring plane, etc.) may be carried out.

The specific embodiments explained with reference to the figures represent preferred or exemplary specific embodiments of the present invention. Instead of the described specific embodiments, other specific embodiments are possible which may include other modifications or combinations of the described features.

With regard to the above-named materials, the possibility exists, for example, of replacing these materials with other materials. Also, other substrates, in which a through-connection or a through-connection structure having the above-described approaches is formed, may be provided with a different design or different structures and/or used with a different semiconductor material than silicon. Through-connections or their trench structures and metallically filled substrate areas may furthermore have shapes that differ from the shown and described ones. Moreover, different processes may be carried out than the ones described and/or additional elements and structures may be formed. Furthermore, the method is not limited to the manufacture of a single through-connection or through-connection structure in a substrate. The method allows multiple or a plurality of through-connections to be formed in a substrate generally simultaneously or in parallel.

Another modification which may be considered is that a masking layer used for etching a trench structure is designed without a perforation or lattice structure, but with an opening structure predefining an etching area. In such a design it is also possible to close off the trench structure within the scope of a (subsequent) formation of a closing layer if the opening structure is designed to have a width enabling this type of closing off.

Furthermore, it is possible to not completely remove a portion of the metallic material formed outside of the substrate area after the application of a metallic material for filling a hollowed-out substrate area, but instead to subject this portion to a structuring to use it to manufacture a printed conductor plane or a rewiring plane, for example. Moreover, it is possible to metallically fill a hollowed-out substrate area only partially so that the metallic material introduced into the relevant substrate area may have a U-shaped cross section.

With regard to the combinations of the described specific embodiments, it is possible, for example, to provide a structure which is comparable to FIG. 25 having multiple substrate areas situated within a trench structure, the substrate areas themselves each enclosing their own trench structure, comparably to FIG. 22.

In deviation from the embodiments of FIGS. 23 and 24, a nested through-connection structure may also be formed using different numbers of trench structures and substrate areas which enclose one another. Other numbers of substrate areas within a trench structure are also possible with regard to the specific embodiment shown in FIG. 25.

With regard to the through-connections having multiple metallically filled substrate areas, e.g., the specific embodiments shown in FIGS. 23 through 25, it is also conceivable to not interconnect the individual substrate areas or to operate them in the form of a parallel circuit but to use the individual metallic substrate areas in the form of separate electrical connections. The prerequisite here is that in the area of the substrate top side and in the area of the substrate bottom side, corresponding contact structures are formed which contact the individual substrate areas separately from one another. Such contact structures may also be formed according to the above-explained approaches, in the form of contact surfaces, printed conductors embedded in an insulating layer, rewiring planes, etc.

What is claimed is:

1. A method for manufacturing a component having a through-connection, comprising:
    providing a substrate;
    forming a trench structure in the substrate, the trench structure being formed to completely surround a substrate area of the substrate;
    forming a closing layer to close off the trench structure, a cavity girded by the closing layer being formed in an area of the trench structure;
    removing substrate material from the substrate area surrounded by the closed-off trench structure; and
    at least partially filling the substrate area surrounded by the closed-off trench structure with a metallic material.

2. The method as recited in claim 1, wherein a masking layer having a lattice structure is formed on the substrate, and the trench structure is formed by carrying out an etching process using the masking layer.

3. The method as recited in claim 1, wherein the forming of the closing layer includes one of: i) forming an insulating layer, or ii) forming a diffusion barrier layer and an insulating layer.

4. The method as recited in claim 1, wherein the substrate is provided with an etch stopping layer, and the forming of the trench structure and removing substrate material from the substrate area surrounded by the closed-off trench structure both include an etching of the substrate until the etch stopping layer is reached.

5. The method as recited in claim 4, wherein the etch stopping layer has a contact surface in an area of the substrate area to be filled with the metallic material.

6. The method as recited in claim 4, wherein a portion of the etch stopping layer is removed after the removal of substrate material from the substrate area surrounded by the closed-off trench structure in order to expose a subarea of a conductive layer provided in an area of the etch stopping layer.

7. The method as recited in claim 1, further comprising:
    carrying out an etching process to form an opening on a substrate side to expose a subarea of the substrate area surrounded by the closed-off trench structure, and wherein the removal of substrate material in the substrate area is carried out in a subsequent etching process using the opening.

8. The method as recited in claim 1, wherein multiple substrate areas are produced which are completely surrounded by the trench structure due to the formation of the trench structure, and wherein after closing off the trench structure, substrate material is removed from the multiple substrate areas which are surrounded by the closed-off trench structure, and the multiple substrate areas are filled at least partially with the metallic material.

9. The method as recited in claim 1, wherein a first and a second trench structure are formed in the substrate, the first trench structure completely surrounding the substrate area, and the substrate area completely surrounding the second trench structure, and wherein by forming the closing layer, the first and the second trench structures are closed off and a first cavity girded by the closing layer is formed in an area of the first trench structure and a second cavity girded by the closing layer is formed in the area of the second trench structure.

10. The method as recited in claim 1, wherein a first and a second trench structure are formed in the substrate, the first trench structure completely surrounding a first substrate area, the first substrate area completely surrounding the second trench structure, and the second trench structure completely surrounding a second substrate area, and wherein by forming the closing layer, the first and the second trench structures are closed off and a first cavity girded by the closing layer is formed in the area of the first trench structure and a second cavity girded by the closing layer is formed in the area of the second trench structure, substrate material being removed in the first and the second substrate areas, and the first and the second substrate areas are filled at least partially with a metallic material.

* * * * *